(12) United States Patent
Kang et al.

(10) Patent No.: US 12,183,800 B2
(45) Date of Patent: Dec. 31, 2024

(54) SEMICONDUCTOR DEVICES

(71) Applicant: Samsung Electronics Co., Ltd., Suwon-si (KR)

(72) Inventors: Myung Gil Kang, Suwon-si (KR); Dong Won Kim, Seongnam-si (KR); Woo Seok Park, Ansan-si (KR); Keun Hwi Cho, Seoul (KR); Sung Gi Hur, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 18/449,734

(22) Filed: Aug. 15, 2023

(65) Prior Publication Data

US 2023/0387237 A1 Nov. 30, 2023

Related U.S. Application Data

(63) Continuation of application No. 18/046,518, filed on Oct. 14, 2022, now Pat. No. 11,769,813, which is a
(Continued)

(30) Foreign Application Priority Data

Jul. 29, 2020 (KR) .................. 10-2020-0094241

(51) Int. Cl.
*H01L 29/423* (2006.01)
*H01L 27/092* (2006.01)
(Continued)

(52) U.S. Cl.
CPC ...... *H01L 29/42392* (2013.01); *H01L 27/092* (2013.01); *H01L 29/0665* (2013.01); *H01L 29/4236* (2013.01); *H01L 29/78696* (2013.01)

(58) Field of Classification Search
CPC ............. H01L 21/02603; H01L 27/092; H01L 29/0665; H01L 29/0669; H01L 29/0673;
(Continued)

(56) References Cited

U.S. PATENT DOCUMENTS 8,916,460 B1 * 12/2014 Kwon ............... H01L 21/845
257/E21.632
9,412,816 B2 8/2016 Yang et al.
(Continued)

*Primary Examiner* — David C Spalla
(74) *Attorney, Agent, or Firm* — Myers Bigel, P.A.

(57) ABSTRACT

Semiconductor devices include a first active pattern including a first lower pattern extending in a first direction and a first sheet pattern spaced apart from the first lower pattern; and a first gate electrode on the first lower pattern, the first gate electrode extending in a second direction and surrounding the first sheet pattern, wherein the first lower pattern includes a first sidewall and a second sidewall opposite to each other, each of the first sidewall of the first lower pattern and the second sidewall of the first lower pattern extends in the first direction, the first gate electrode overlaps the first sidewall of the first lower pattern in the second direction by a first depth, the first gate electrode overlaps the second sidewall of the first lower pattern in the second direction by a second depth, and the first depth is different from the second depth.

20 Claims, 27 Drawing Sheets

Related U.S. Application Data continuation of application No. 17/209,290, filed on Mar. 23, 2021, now Pat. No. 11,482,606.

(51) Int. Cl.
*H01L 29/06* (2006.01)
*H01L 29/786* (2006.01)

(58) Field of Classification Search
CPC ........... H01L 29/4236; H01L 29/42392; H01L 29/66439; H01L 29/6681; H01L 29/775; H01L 29/78696
See application file for complete search history.

(56) References Cited

U.S. PATENT DOCUMENTS

| | | | |
|---|---|---|---|
| 9,805,988 B1 | 10/2017 | Bentley et al. | |
| 9,953,885 B2 | 4/2018 | Yuan et al. | |
| 10,453,752 B2 | 10/2019 | Van Dal et al. | |
| 10,566,245 B2* | 2/2020 | Kwon | H01L 29/66439 |
| 11,557,653 B2 | 1/2023 | Jeong et al. | |
| 2016/0204195 A1* | 7/2016 | Wen | H01L 29/66439 |
| | | | 438/157 |
| 2017/0092728 A1* | 3/2017 | Kim | H01L 29/785 |
| 2019/0067434 A1 | 2/2019 | Zhou | |
| 2019/0172828 A1 | 6/2019 | Smith et al. | |
| 2020/0006333 A1* | 1/2020 | Noh | H01L 29/78696 |
| 2020/0052125 A1 | 2/2020 | Zhou et al. | |
| 2021/0408010 A1* | 12/2021 | Lien | H01L 29/0673 |

\* cited by examiner

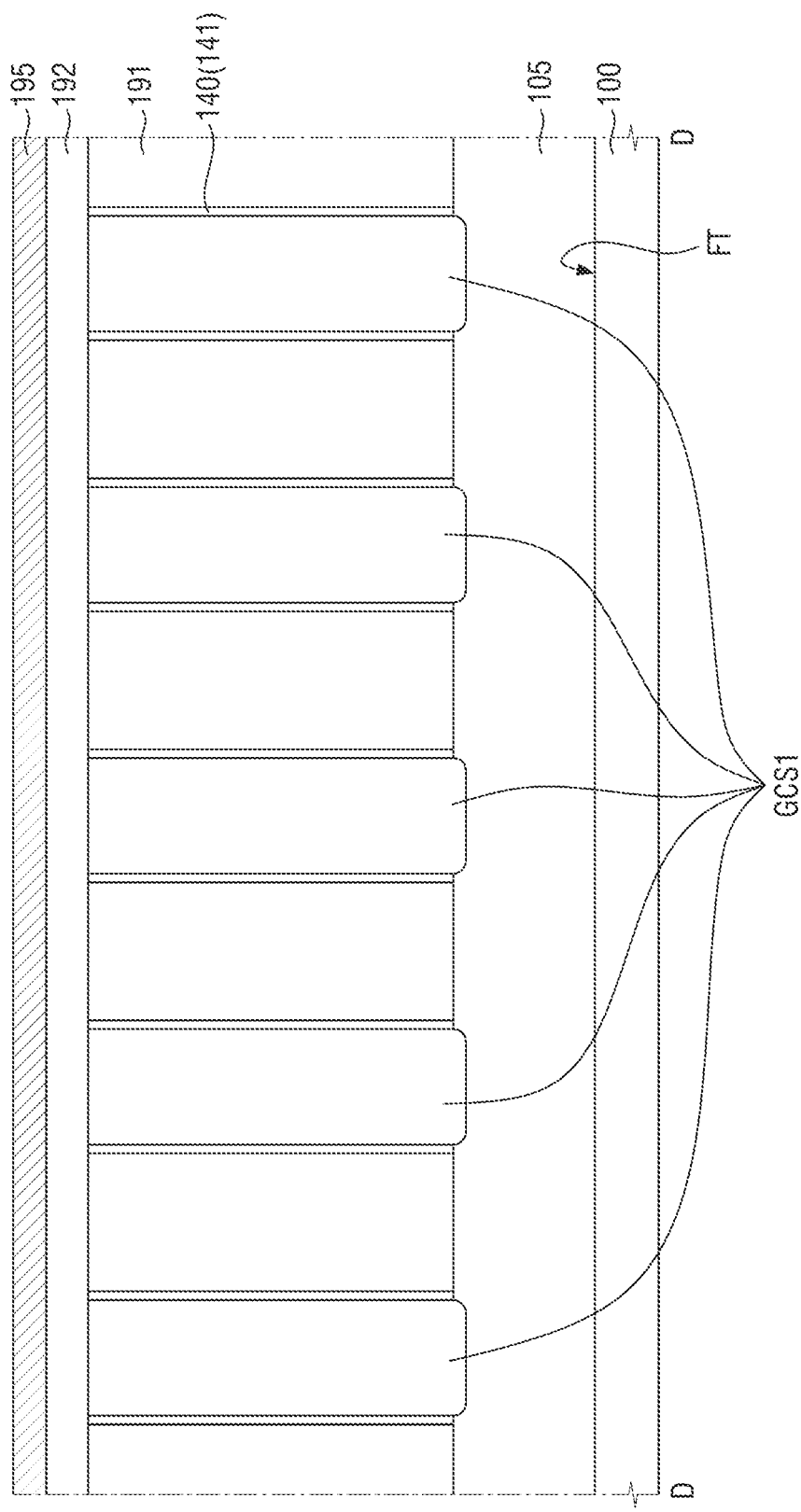

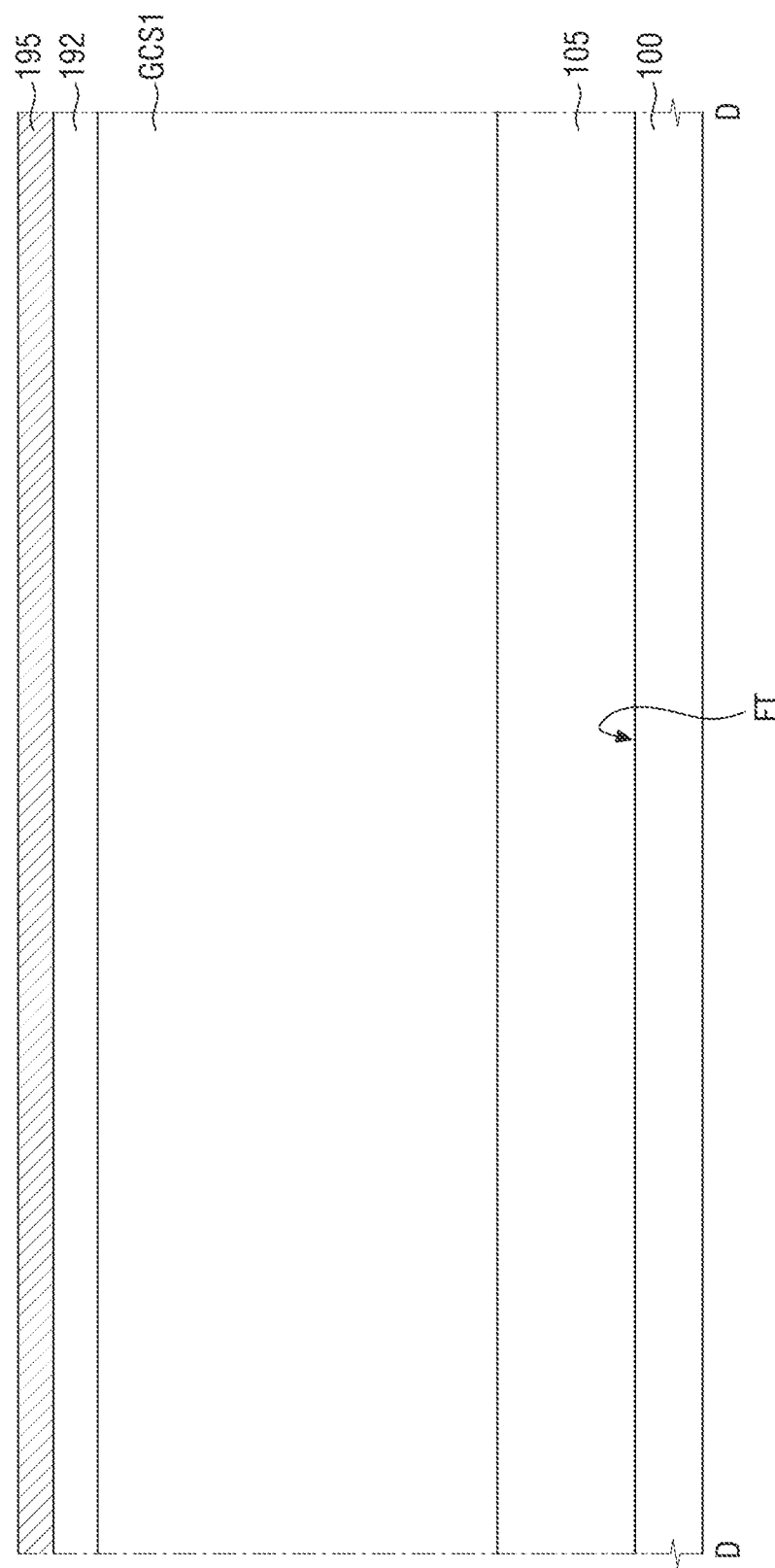

SEMICONDUCTOR DEVICES

CROSS-REFERENCE TO RELATED APPLICATIONS

This application is a continuation of U.S. patent application Ser. No. 18/046,518, filed Oct. 14, 2022, which is a continuation of U.S. patent application Ser. No. 17/209,290, filed Mar. 23, 2021, which claims priority to Korean Patent Application No. 10-2020-0094241 filed on Jul. 29, 2020, in the Korean Intellectual Property Office, and all the benefits accruing therefrom under 35 U.S.C. 119, the disclosure of which in its entirety is herein incorporated by reference.

BACKGROUND

1. Technical Field

The present disclosure generally relates to a semiconductor device, and more particularly, to a semiconductor device including a Multi-Bridge Channel Field Effect Transistor (MBCFET™).

2. Description of the Related Art

As semiconductor devices become highly integrated, it becomes increasingly difficult to meet transistor performance demands of users. In order to overcome these technical difficulties, various field effect transistor structures have been proposed. For example, a high dielectric film-metal gate structure has been proposed to replace a conventional field effect transistor which uses silicon oxide and polycrystalline silicon as a gate insulating layer and a gate electrode material, respectively.

As sizes of field effect transistors decrease, a gate length and a channel length thereof also decrease. Accordingly, in order to improve operation stability and reliability of transistors, which are ones of important factors in determining the performance of integrated circuits, various efforts have been made to improve manufacturing processes and structures of integrated circuit devices.

SUMMARY

Aspects of the present disclosure provide semiconductor devices capable of improving performance and reliability of MBCFET™.

Aspects of the present disclosure also provide methods of manufacturing a semiconductor device capable of improving performance and reliability of MBCFET™.

According to some embodiments of the present inventive concept, semiconductor devices comprising: a first active pattern including a first lower pattern extending in a first direction and a first sheet pattern spaced apart from the first lower pattern; and a first gate electrode on the first lower pattern, the first gate electrode extending in a second direction different from the first direction and surrounding the first sheet pattern, wherein the first lower pattern includes a first sidewall and a second sidewall opposite to each other, each of the first sidewall of the first lower pattern and the second sidewall of the first lower pattern extends in the first direction, the first gate electrode overlaps the first sidewall of the first lower pattern in the second direction by a first depth, the first gate electrode overlaps the second sidewall of the first lower pattern in the second direction by a second depth, and the first depth is different from the second depth.

According to some embodiments of the present inventive concept, semiconductor devices comprising: a first active pattern including a first lower pattern extending in a first direction on a substrate and a first sheet pattern spaced apart from the first lower pattern; a second active pattern including a second lower pattern spaced apart from the first lower pattern in a second direction that is different from the first direction, and a second sheet pattern spaced apart from the second lower pattern; a first gate electrode on the first lower pattern, the first gate electrode extending in the second direction, and surrounding the first sheet pattern; and a second gate electrode on the second lower pattern, the second gate electrode extending in the second direction, and surrounding the second sheet pattern, wherein the first lower pattern includes a first sidewall and a second sidewall opposite to each other and a first top surface between the first sidewall and the second sidewall of the first lower pattern, each of the first sidewall of the first lower pattern and the second sidewall of the first lower pattern extends in the first direction, the second lower pattern includes a third sidewall facing the second sidewall of the first lower pattern, a fourth sidewall opposite to the third sidewall and a second top surface between the third sidewall and the fourth sidewall of the second lower pattern, the first gate electrode comprises a first portion that is adjacent the first sidewall of the first lower pattern and protrudes beyond the first top surface toward the substrate by a first depth, the second gate electrode comprises a fourth portion that is adjacent the fourth sidewall of the second lower pattern and protrudes beyond the second top surface toward the substrate by a fourth depth, and the first depth is different from the fourth depth.

According to some embodiments of the present inventive concept, semiconductor devices comprising: a first cell isolation structure and a second cell isolation structure spaced apart from each other in a first direction; a first lower pattern between the first cell isolation structure and the second cell isolation structure, the first lower pattern extending in a second direction that is different from the first direction; a second lower pattern between the first cell isolation structure and the second cell isolation structure, the second lower pattern being spaced apart from the first lower pattern in the first direction; a first sheet pattern above the first lower pattern, the first sheet pattern being spaced apart from the first lower pattern; a second sheet pattern above the second lower pattern, the second sheet pattern being spaced apart from the second lower pattern; a first gate insulating layer extending on a top surface of the first lower pattern and a surface of the first sheet pattern, and extending along a sidewall of the first cell isolation structure; and a first gate electrode on the first gate insulating layer, the first gate electrode surrounding the first sheet pattern, wherein the first lower pattern includes a first sidewall and a second sidewall opposite to each other, each of the first sidewall of the first lower pattern and the second sidewall of the first lower pattern extends in the second direction, the second lower pattern includes a third sidewall facing the second sidewall of the first lower pattern, and a fourth sidewall opposite to the third sidewall, the first gate electrode overlaps the first sidewall of the first lower pattern in the first direction by a first depth, the first gate electrode overlaps the second sidewall of the first lower pattern in the first direction by a second depth, and the first depth is different from the second depth.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

BRIEF DESCRIPTION OF THE DRAWINGS

The above and other aspects and features of the present disclosure will become more apparent by describing in detail exemplary embodiments thereof with reference to the attached drawings, in which:

FIGS. 5A and 5B are cross-sectional views taken along line D-D of FIG. 1 according to some embodiments of the present inventive concept;

DETAILED DESCRIPTION

Figure 1:
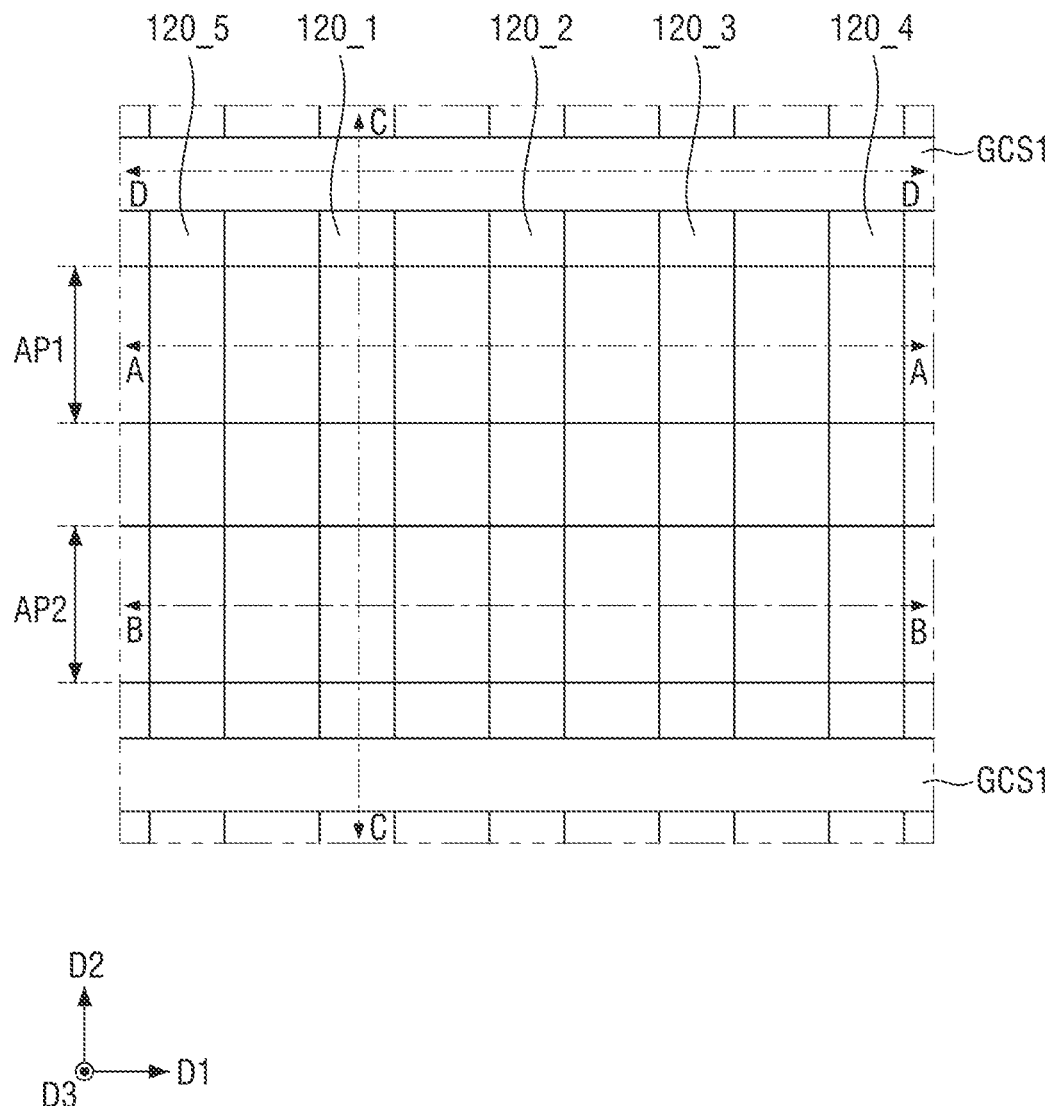
FIG. 1 is a layout diagram illustrating a semiconductor device according to some embodiments of the present inventive concept.
Figure 2:
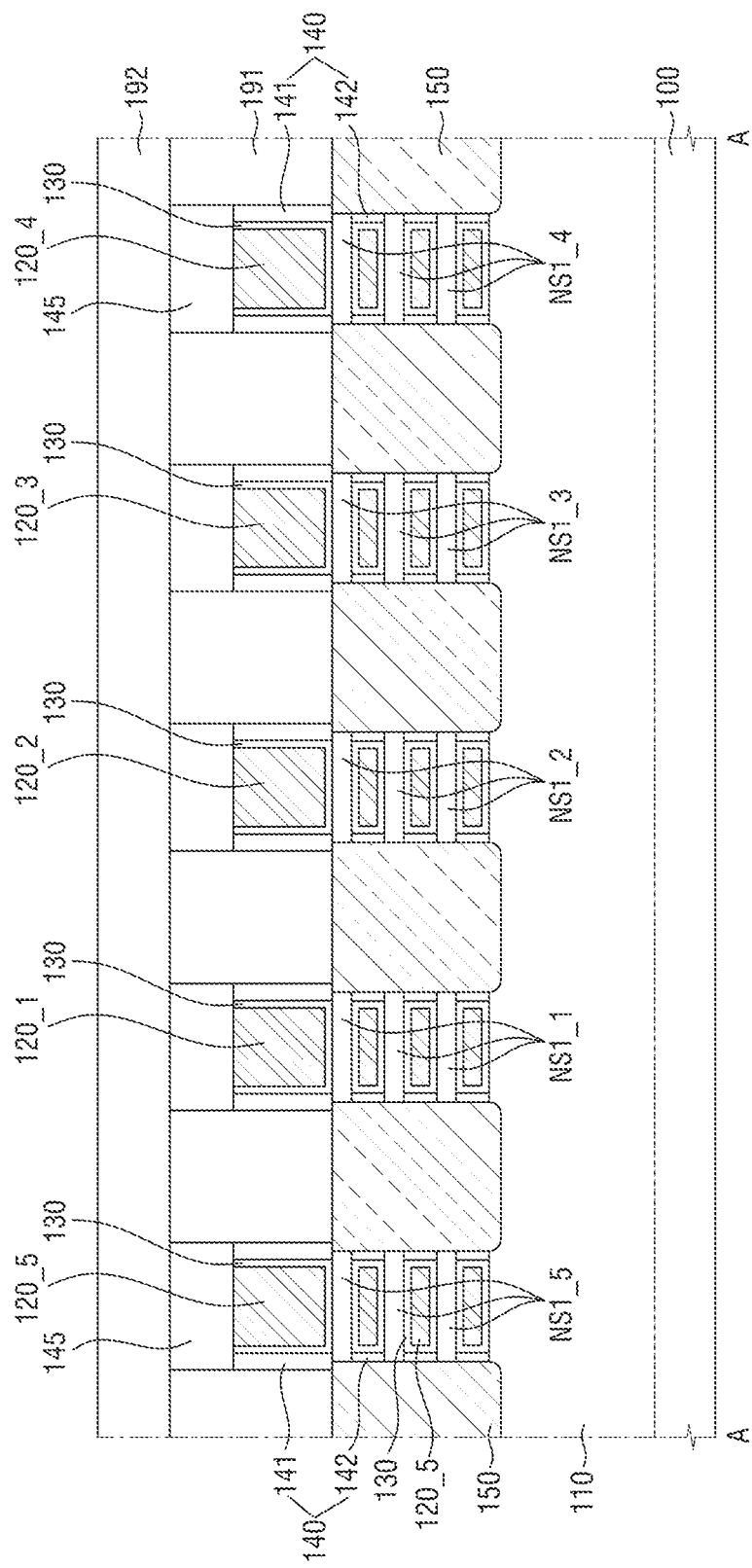
FIG. 2 is a cross-sectional view taken along line A-A of FIG. 1 according to some embodiments of the present inventive concept.
Figure 3:
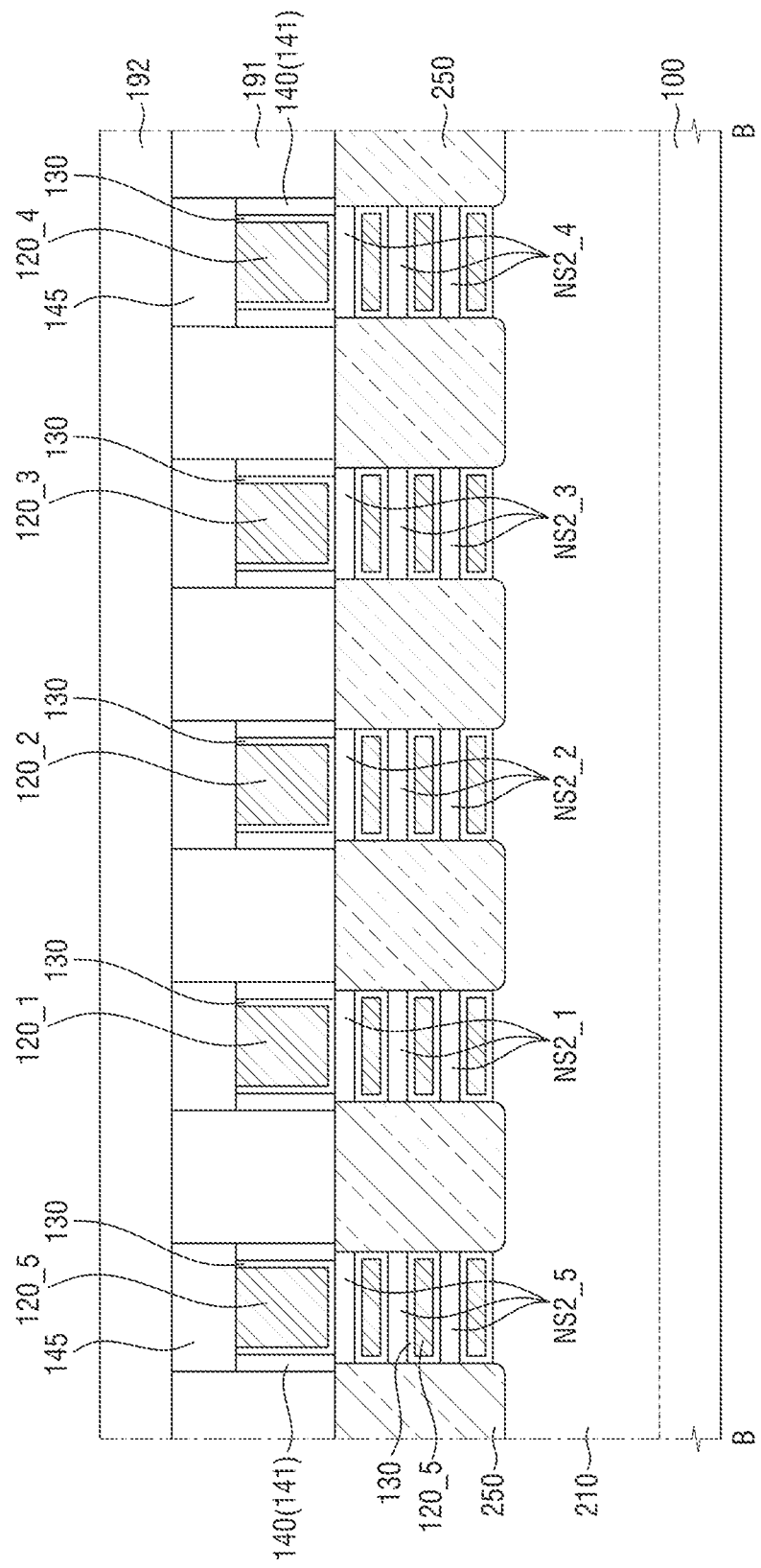
FIG. 3 is a cross-sectional view taken along line B-B of FIG. 1 according to some embodiments of the present inventive concept.
Figure 4A:
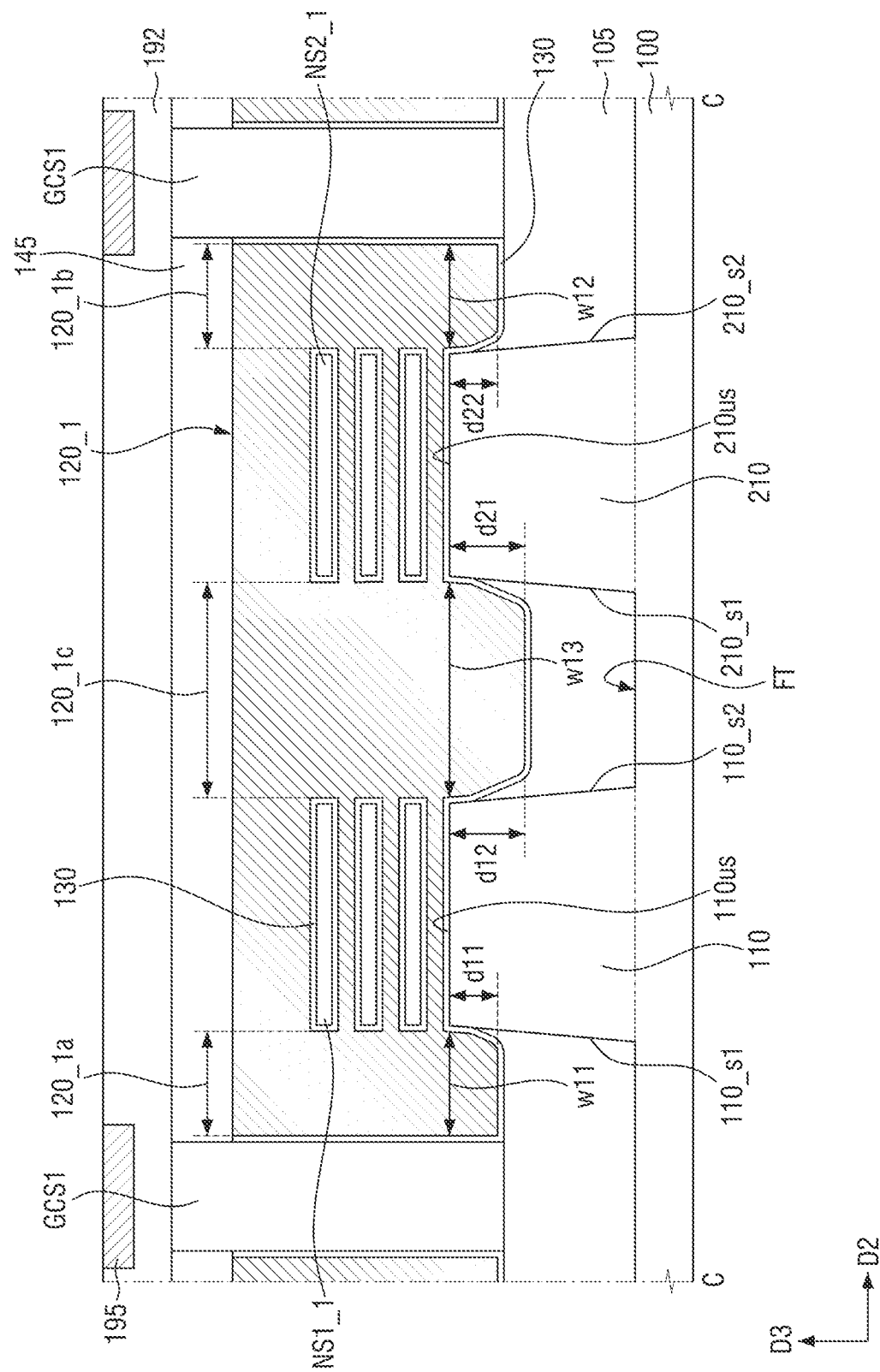
FIGS. 4A and 4B are cross-sectional views taken along line C-C of FIG. 1 according to some embodiments of the present inventive concept.
Figure 4B:
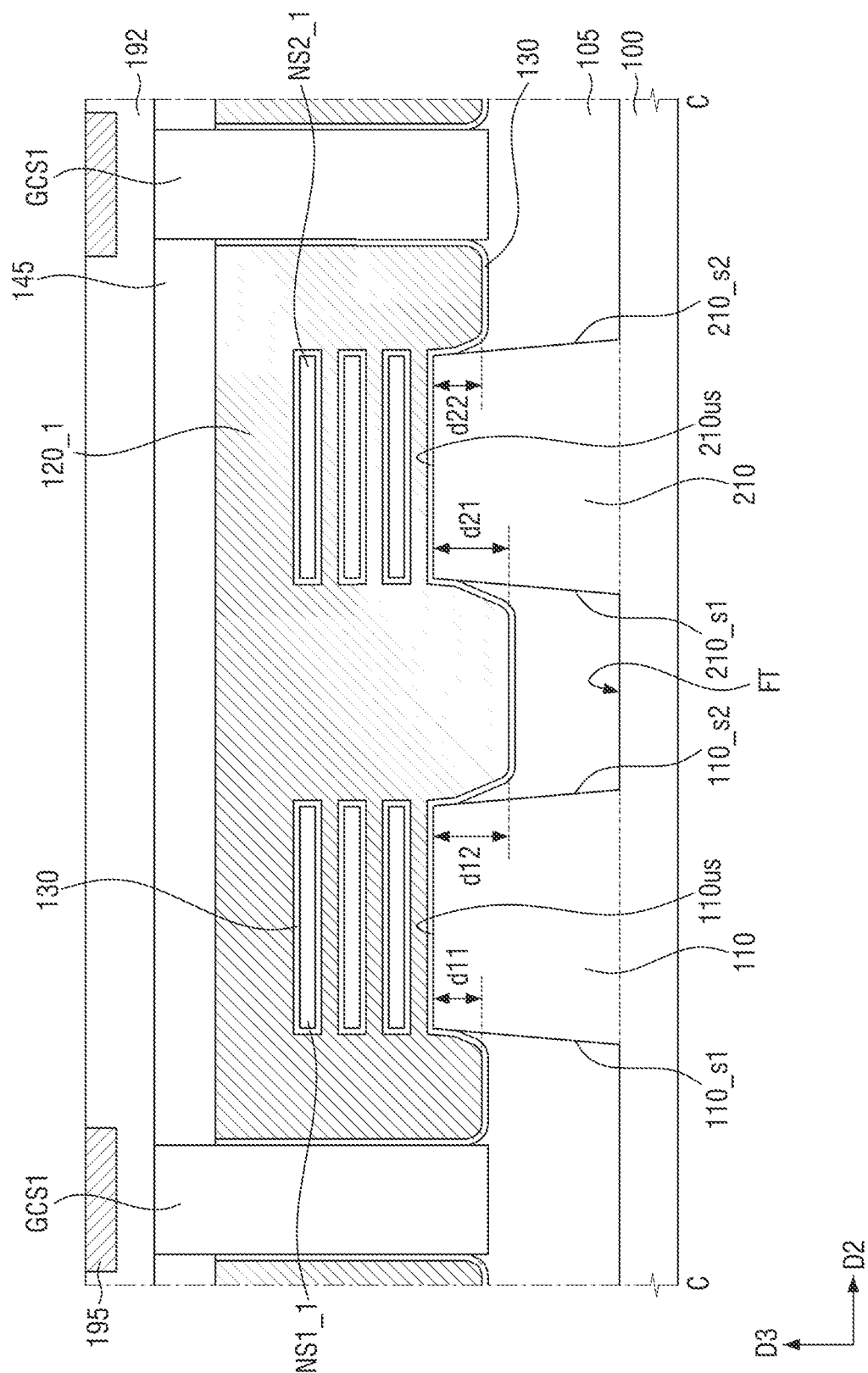

FIG. 1 is a layout diagram illustrating a semiconductor device according to some embodiments of the present inventive concept. FIG. 2 is a cross-sectional view taken along line A-A of FIG. 1. FIG. 3 is a cross-sectional view taken along line B-B of FIG. 1. FIGS. 4A and 4B are cross-sectional views taken along line C-C of FIG. 1. FIGS. 5A and 5B are cross-sectional views taken along line D-D of FIG. 1.

For simplicity of description, interlayer insulating layers 191 and 192 and a wiring line 195 are not illustrated in FIG. 1.

Referring to FIGS. 1 to 5B, a semiconductor device according to some embodiments may include a first active pattern AP1, a second active pattern AP2, and a plurality of first gate electrodes 120_1, 120_2, 120_3, 120_4, and 120_5, and first gate isolation structures GCS1.

A substrate 100 may be, for example, a bulk silicon or silicon-on-insulator (SOI) substrate. In some embodiments, the substrate 100 may be a silicon substrate, or may include other materials such as silicon germanium, silicon germanium on insulator (SGOI), indium antimonide, a lead tellurium compound, indium arsenide, indium phosphide, gallium arsenide, or gallium antimonide, but the present inventive concept is not limited thereto.

The first active pattern AP1 and the second active pattern AP2 may be disposed on the substrate 100. Each of the first active pattern AP1 and the second active pattern AP2 may be elongated in a first direction D1. The first active pattern AP1 and the second active pattern AP2 may be disposed to be spaced apart from each other in a second direction D2. For example, the first direction D1 is a direction traversing or crossing the second direction D2. In some embodiments, the first direction D1 and the second direction D2 may be perpendicular to each other. As used herein, "an element A is elongated in a direction X" (or similar language) may mean that the element A extends longitudinally in the direction X.

In some embodiments, the first active pattern AP1 may be a region in which a PMOS is formed, and the second active pattern AP2 may be a region in which an NMOS is formed. In some embodiments, the first active pattern AP1 may be a region in which an NMOS is formed, and the second active pattern AP2 may be a region in which a PMOS is formed. For example, the first active pattern AP1 and the second active pattern AP2 may be active regions included in a single standard cell.

The first active pattern AP1 may include a first lower pattern 110 and a plurality of first sheet patterns NS1_1, NS1_2, NS1_3, NS1_4, and NS1_5. The second active pattern AP2 may include a second lower pattern 210 and a plurality of second sheet patterns NS2_1, NS2_2, NS2_3, NS2_4, and NS2_5.

Each of the first lower pattern 110 and the second lower pattern 210 may protrude from the substrate 100. Each of the first lower pattern 110 and the second lower pattern 210 may be elongated in the first direction D1.

The first lower pattern 110 and the second lower pattern 210 may be spaced apart from each other in the second direction D2. The first lower pattern 110 and the second lower pattern 210 may be separated from each other by a fin trench FT extending in the first direction D1.

The first lower pattern 110 may include a first sidewall 110_s1 and a second sidewall 110_s2 opposite to each other. The first sidewall 110_s1 of the first lower pattern and the second sidewall 110_s2 of the first lower pattern 110 may extend in the first direction D1. The first sidewall 110_s1 of the first lower pattern 110 and the second sidewall 110_s2 of the first lower pattern 110 may each be defined by the fin trench FT.

The first lower pattern 110 may include a top surface 110us connecting the first sidewall 110_s1 of the first lower pattern 110 to the second sidewall 110_s2 of the first lower pattern 110. The top surface 110us of the first lower pattern 110 may extend in the first direction D1.

The second lower pattern 210 may include a first sidewall 210_s1 and a second sidewall 210_s2 opposite to each other. The first sidewall 210_s1 of the second lower pattern 210 and the second sidewall 210_s2 of the second lower pattern 210 may extend in the first direction D1. The first sidewall 210_s1 of the second lower pattern 210 and the second sidewall 210_s2 of the second lower pattern 210 may each be defined by the fin trench FT. The first sidewall 210_s1 of the second lower pattern 210 may face the second sidewall 110_s2 of the first lower pattern 110.

The second lower pattern 210 may include a top surface 210us connecting the first sidewall 210_s1 of the second lower pattern 210 to the second sidewall 210_s2 of the second lower pattern 210. The top surface 210us of the second lower pattern 210 may extend in the first direction D1.

The plurality of first sheet patterns NS1_1, NS1_2, NS1_3, NS1_4, and NS1_5 may be disposed above the first lower pattern 110. The plurality of first sheet patterns NS1_1, NS1_2, NS1_3, NS1_4, and NS1_5 may be spaced apart from the first lower pattern 110 in a third direction D3. The plurality of first sheet patterns NS1_1, NS1_2, NS1_3, NS1_4, and NS1_5 spaced apart from each other may be arranged in the first direction D1 along the top surface 110us of the first lower pattern 110. In some embodiments, the third direction D3 may be perpendicular to both the first direction D1 and the second direction D2.

The plurality of second sheet patterns NS2_1, NS2_2, NS2_3, NS2_4, and NS2_5 may be disposed above the second lower pattern 210. The plurality of second sheet patterns NS2_1, NS2_2, NS2_3, NS2_4, and NS2_5 may be spaced apart from the second lower pattern 210 in the third direction D3. The plurality of second sheet patterns NS2_1, NS2_2, NS2_3, NS2_4, and NS2_5 spaced apart from each other may be arranged in the first direction D1 along the top surface 210us of the second lower pattern 210.

Each of the plurality of first sheet patterns NS1_1, NS1_2, NS1_3, NS1_4, and NS1_5 may include a plurality of nanosheets sequentially arranged in the third direction D3. Each of the plurality of second sheet patterns NS2_1, NS2_2, NS2_3, NS2_4, and NS2_5 may include a plurality of nanosheets sequentially arranged in the third direction D3. Here, the third direction D3 may be a direction crossing the first direction D1 and the second direction D2. For example, the third direction D3 may be a thickness direction of the substrate 100.

In FIGS. 2 and 3, each of the first sheet patterns NS1_1, NS1_2, NS1_3, NS1_4, and NS1_5 and each of the second sheet patterns NS2_1, NS2_2, NS2_3, NS2_4, and NS2_5 are shown as including three nanosheets arranged in the third direction D3. However, this is merely for simplicity of description and the present disclosure is not limited thereto.

Each of the first lower pattern 110 and the second lower pattern 210 may be formed by etching a portion of the substrate 100 and may include an epitaxial layer grown from the substrate 100. Each of the first lower pattern 110 and the second lower pattern 210 may include, for example, silicon or germanium, which is an elemental semiconductor material. In some embodiments, the first lower pattern 110 and the second lower pattern 210 may include a compound semiconductor, for example, a group IV-IV compound semiconductor or a group III-V compound semiconductor.

The group IV-IV compound semiconductor may be a binary compound or a ternary compound including at least two elements selected from the group consisting of carbon (C), silicon (Si), germanium (Ge) and tin (Sn), or the above-mentioned compound doped with a group IV element.

The group III-V compound semiconductor may be, for example, a binary compound, a ternary compound or a quaternary compound formed by combining at least one of aluminum (Al), gallium (Ga) and indium (In) which are group III elements with one of phosphorus (P), arsenic (As) and antimony (Sb) which are group V elements.

Each of the first sheet patterns NS1_1, NS1_2, NS1_3, NS1_4, and NS1_5 may include, for example, silicon or germanium, which is an elemental semiconductor material, the group IV-IV compound semiconductor, or the group III-V compound semiconductor. Each of the second sheet patterns NS2_1, NS2_2, NS2_3, NS2_4, and NS2_5 may include, for example, silicon or germanium, which is an elemental semiconductor material, the group IV-IV compound semiconductor, or the group III-V compound semiconductor.

The width of the first sheet pattern NS1_1, NS1_2, NS1_3, NS1_4, NS1_5 in the second direction D2 may increase or decrease in proportion to the width of the first lower pattern 110 in the second direction D2.

A field insulating layer 105 may be formed on the substrate 100. The field insulating layer 105 may fill at least a portion of the fin trench FT.

In some embodiments, the field insulating layer 105 may cover a portion of the first sidewall 110_s1 of the first lower pattern 110 and/or a portion of the second sidewall 110_s2 of the first lower pattern 110. The field insulating layer 105 may cover a portion of the first sidewall 210_s1 of the second lower pattern 210 and/or a portion of the second sidewall 210_s2 of the second lower pattern 210. A portion of the first lower pattern 110 may protrude upward in the third direction D3 beyond the top surface of the field insulating layer 105.

Unlike the illustrated example, in some embodiments, the field insulating layer 105 may entirely cover the first sidewall 110_s1 of the first lower pattern 110 and the second sidewall 110_s2 of the first lower pattern 110. The field insulating layer 105 may entirely cover the first sidewall 210_s1 of the second lower pattern 210 and the second sidewall 210_s2 of the second lower pattern 210.

Each of the first sheet patterns NS1_1, NS1_2, NS1_3, NS1_4, and NS1_5 and each of the second sheet patterns NS2_1, NS2_2, NS2_3, NS2_4, and NS2_5 are disposed higher than the top surface of the field insulating layer 105. As used herein, "an element A is disposed higher than an element B" (or similar language) may mean that the element A is higher than the element B relative to the substrate 100.

The field insulating layer 105 may include, for example, an oxide layer, a nitride layer, an oxynitride layer, or a combination layer thereof.

The plurality of first gate electrodes 120_1, 120_2, 120_3, 120_4, and 120_5 may be disposed above the field insulating layer 105. Each of the first gate electrodes 120_1, 120_2, 120_3, 120_4, and 120_5 may extend in the second direction D2. The first gate electrodes 120_1, 120_2, 120_3, 120_4, and 120_5 may be disposed to be spaced apart from each other in the first direction D1.

Each of the first gate electrodes 120_1, 120_2, 120_3, 120_4, and 120_5 may cross the first active pattern AP1 and the second active pattern AP2. Each of the first gate electrodes 120_1, 120_2, 120_3, 120_4, and 120_5 may cross the first lower pattern 110 and the second lower pattern 210.

Each of the first gate electrodes 120_1, 120_2, 120_3, 120_4, and 120_5 may be disposed above the first lower pattern 110 and the second lower pattern 210. The first gate electrodes 120_1, 120_2, 120_3, 120_4, and 120_5 may respectively surround the first sheet patterns NS1_1, NS1_2, NS1_3, NS1_4, and NS1_5. The first gate electrodes 120_1, 120_2, 120_3, 120_4, and 120_5 may respectively surround the second sheet patterns NS2_1, NS2_2, NS2_3, NS2_4, and NS2_5. As used herein, "an element A surrounds an element B" (or similar language) may means that the element A extends on a surface of the element B but does not necessarily mean that the element A completely encloses the element B.

The first gate electrodes 120_1, 120_2, 120_3, 120_4, and 120_5 may include at least one of a metal, a metal alloy, a conductive metal nitride, a metal silicide, a doped semiconductor material, a conductive metal oxide, or a conductive metal oxynitride. The first gate electrodes 120_1, 120_2, 120_3, 120_4, and 120_5 may include, for example, at least one selected from the group consisting of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Jr), osmium (Os), silver (Ag), gold (Au), zinc (Zn), vanadium (V) and a combination thereof, but are not limited thereto. The conductive metal oxide and the conductive metal oxynitride may include a form in which the above-mentioned material is oxidized, but are not limited thereto.

The number of the first gate electrodes 120_1, 120_2, 120_3, 120_4, and 120_5 is shown as being five, but is merely for simplicity of description and is not limited thereto. The number of the first gate electrodes 120_1, 120_2, 120_3, 120_4, and 120_5 may be greater or smaller than five.

A first gate insulating layer 130 may extend along the top surface of the field insulating layer 105, the top surface 110us of the first lower pattern 110, and the top surface 210us of the second lower pattern 210. The first gate insulating layer 130 may enclose or wrap each of the first sheet patterns NS1_1, NS1_2, NS1_3, NS1_4, and NS1_5. The first gate insulating layer 130 may be disposed along the circumference of each of the first sheet patterns NS1_1, NS1_2, NS1_3, NS1_4, and NS1_5. The first gate insulating layer 130 may enclose or wrap each of the second sheet patterns NS2_1, NS2_2, NS2_3, NS2_4, and NS2_5. The first gate insulating layer 130 may be disposed along the circumference of each of the second sheet patterns NS2_1, NS2_2, NS2_3, NS2_4, and NS2_5.

The first gate electrodes 120_1, 120_2, 120_3, 120_4, and 120_5 may be disposed on the first gate insulating layer 130.

The first gate insulating layer 130 may include, for example, silicon oxide, silicon oxynitride, silicon nitride, or a high-k material having a higher dielectric constant than silicon oxide. The high-k material may include, for example, at least one selected from the group consisting of boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

A plurality of first epitaxial patterns 150 may be disposed on the first lower pattern 110. The plurality of first epitaxial patterns 150 may be disposed between the first gate electrodes 120_1, 120_2, 120_3, 120_4, and 120_5 that are adjacent in the first direction D1. Each of the first epitaxial patterns 150 may be connected to the first sheet patterns NS1_1, NS1_2, NS1_3, NS1_4, and NS1_5 adjacent in the first direction D1. In some embodiments, each of the first epitaxial patterns 150 may contact two of the first sheet patterns NS1_1, NS1_2, NS1_3, NS1_4, and NS1_5 adjacent in the first direction D1 as illustrated in FIG. 2.

A plurality of second epitaxial patterns 250 may be disposed on the second lower pattern 210. The plurality of second epitaxial patterns 250 may be disposed between the first gate electrodes 120_1, 120_2, 120_3, 120_4, and 120_5 adjacent in the first direction D1. Each of the second epitaxial patterns 250 may be connected to the second sheet patterns NS2_1, NS2_2, NS2_3, NS2_4, and NS2_5 adjacent in the first direction D1. In some embodiments, each of the second epitaxial patterns 250 may contact two of the second sheet patterns NS2_1, NS2_2, NS2_3, NS2_4, and NS2_5 adjacent in the first direction D1 as illustrated in FIG. 3.

Each of the plurality of first epitaxial patterns 150 may be included in a source/drain of a transistor that uses one of the first sheet patterns NS1_1, NS1_2, NS1_3, NS1_4, and NS1_5 as a channel region. Each of the plurality of second epitaxial patterns 250 may be included in a source/drain of a transistor that uses the second sheet patterns NS2_1, NS2_2, NS2_3, NS2_4, and NS2_5 as a channel region.

Although not shown, a source/drain contact may be disposed on the plurality of first epitaxial patterns 150 and the plurality of second epitaxial patterns 250. In addition, a metal silicide layer may be further disposed between the source/drain contact and the epitaxial patterns 150 and 250.

A gate spacer 140 may be disposed on the sidewall of each of the first gate electrodes 120_1, 120_2, 120_3, 120_4, and 120_5.

In FIG. 2, the gate spacer 140 disposed above the first lower pattern 110 may include an outer spacer 141 and an inner spacer 142. The inner spacer 142 may be disposed between the first sheet patterns NS1_1, NS1_2, NS1_3, NS1_4, NS1_5 adjacent in the third direction D3. In FIG. 3, the gate spacer 140 disposed above the second lower pattern 210 may include only the outer spacer 141 without including the inner spacer 142.

Unlike the illustrated example, in some embodiments, the gate spacer 140 disposed above the first lower pattern 110 and the gate spacer 140 disposed above the second lower pattern 210 may both include the outer spacer 141 and the inner spacer 142. Unlike the illustrated example, in some embodiments, the gate spacer 140 disposed above the first lower pattern 110 and the gate spacer 140 disposed above the second lower pattern 210 may both include only the outer spacer 141 without including the inner spacer 142.

The outer spacer 141 and the inner spacer 142 may each include, for example, at least one of silicon nitride (SiN), silicon oxynitride (SiON), silicon oxide (SiO$_2$), silicon oxynitride (SiOCN), silicon boron nitride (SiBN), silicon oxyboron nitride (SiOBN), silicon oxycarbide (SiOC), or a combination thereof.

A first gate capping pattern 145 may be disposed on the first gate electrode 120_1, 120_2, 120_3, 120_4, 120_5 and the gate spacer 140. The top surface of the first gate capping pattern 145 may lie on the same plane as the top surface of a first interlayer insulating layer 191. The top surface of the first gate capping pattern 145 and the top surface of the first interlayer insulating layer 191 may be at the same level from the substrate 100.

Unlike the illustrated example, in some embodiments, the first gate capping pattern 145 may be disposed between the gate spacers 140.

The first gate capping pattern 145 may include, for example, at least one of silicon nitride (SiN), silicon oxynitride (SiON), silicon oxide (SiO$_2$), silicon carbonitride (SiCN), silicon oxycarbonitride (SiOCN), or a combination thereof.

The first gate isolation structure GCS1 may be disposed above the substrate 100. The first gate isolation structure GCS1 may be disposed on the field insulating layer 105.

In some embodiments, two first gate isolation structures GCS1 may be disposed to be spaced apart from each other in the second direction D2. The first active pattern AP1 and the second active pattern AP2 may be disposed between the two first gate isolation structures GCS1 that are adjacent in the second direction D2.

For example, the first lower pattern 110 and the second lower pattern 210 may be disposed between the two first gate isolation structures GCS1 adjacent in the second direction D2. A first one of the two first gate isolation structures GCS1 is disposed closer to the first sidewall 110_s1 of the first lower pattern 110 than to the second sidewall 110_s2 of the first lower pattern 110. A second one of the two first gate isolation structures GCS1 is disposed closer to the second sidewall 210_s2 of the second lower pattern 210 than to the first sidewall 210_s1 of the second lower pattern 210. In some embodiments, the first lower pattern 110 and the second lower pattern 210 may be included in a single standard cell that includes a first cell boundary and a second cell boundary spaced apart from each other in the second direction D2. The first one of the two first gate isolation structure GCS1 may be on or adjacent the first cell boundary, and the second one of the two first gate isolation structure GCS1 may be on or adjacent the second cell boundary.

Each of the first gate electrodes 120_1, 120_2, 120_3, 120_4, and 120_5 may be disposed between the two first gate isolation structures GCS1 adjacent in the second direction D2. The first gate isolation structure GCS1 may separate the gate electrodes adjacent in the second direction D2.

That is, each of the first gate electrodes 120_1, 120_2, 120_3, 120_4, and 120_5 may be separated from other gate electrodes adjacent in the second direction D2 by the first gate isolation structures GCS1. Each of the first gate electrodes 120_1, 120_2, 120_3, 120_4, and 120_5 may include a short sidewall including a short side. The short sidewall of each of the first gate electrodes 120_1, 120_2, 120_3, 120_4, and 120_5 may face a sidewall of the first gate isolation structure GCS1.

In other words, each of the first gate electrodes 120_1, 120_2, 120_3, 120_4, and 120_5 may include a first end and a second end, each of which is included in the short sidewall. The two first gate isolation structures GCS1 may be disposed, respectively, at the first end and the second end of each of the first gate electrodes 120_1, 120_2, 120_3, 120_4 and 120_5 as illustrated in FIGS. 1, 4A, and 4B.

The first gate insulating layer 130 may extend along the sidewall of the first gate isolation structure GCS1. The first gate insulating layer 130 may extend between the sidewall of the first gate isolation structure GCS1 and the short sidewall of the first gate electrode 120_1, 120_2, 120_3, 120_4, 120_5.

Referring to FIG. 5A, in some embodiments, the first gate isolation structure GCS1 may include a plurality of gate isolation patterns disposed to be spaced apart in the first direction D1. The gate isolation patterns may be disposed at positions corresponding to the short sidewalls of the first gate electrodes 120_1, 120_2, 120_3, 120_4, and 120_5. The first interlayer insulating layer 191 may be disposed between the gate isolation patterns. Further, the gate spacer 140 (e.g., the outer spacer 141) may be disposed on the sidewall of each gate isolation pattern. Unlike the illustrated example, the gate spacer 140 may not be disposed on the sidewall of each gate isolation pattern.

Referring to FIG. 5B, in some embodiments, the first gate isolation structure GCS1 may have a line shape elongated in the first direction D1 (see FIG. 1). The first gate isolation structure GCS1 may be disposed not only at positions corresponding to the short sides of the first gate electrodes 120_1, 120_2, 120_3, 120_4, and 120_5, but also between the first gate electrodes 120_1, 120_2, 120_3, 120_4, and 120_5.

In the semiconductor device according to some embodiments, the first gate isolation structure GCS1 may be disposed along a boundary of a standard cell. For example, the first gate isolation structure GCS1 may be a standard cell isolation structure.

The first gate isolation structure GCS1 may include, for example, at least one of silicon nitride (SiN), silicon oxynitride (SiON), silicon oxide (SiO$_2$), silicon oxynitride (SiOCN), silicon boron nitride (SiBN), silicon oxyboron nitride (SiOBN), silicon oxycarbide (SiOC), aluminum oxide (AlO), or a combination thereof. The first gate isolation structure GCS1 is illustrated as a single layer, but is not limited thereto.

The top surface of the first gate isolation structure GCS1 may lie on the same plane as the top surface of the first gate capping pattern 145. The top surface of the first gate isolation structure GCS1 and the top surface of the first gate capping pattern 145 may be at the same level from the substrate 100.

In some embodiments, as illustrated in FIG. 4A, the top surface of the field insulating layer 105 may be flat at a boundary portion with (e.g., adjacent a corner of) the first gate isolation structure GCS1. In some embodiments, as illustrated in FIG. 4B, the top surface of the field insulating layer 105 may have a downwardly curved surface at the boundary portion with (e.g., adjacent a corner of) the first gate isolation structure GCS1.

At the boundary portion with the first gate isolation structure GCS1, the profile of the first gate insulating layer 130 and the shape of the bottom surface of the first gate electrode 120_1 may vary depending on the shape of the top surface of the field insulating layer 105.

The following description will be made using one first_first gate electrode 120_1 with reference to FIGS. 4A and 4B, but it may also be applicable to the other first gate electrodes 120_2, 120_3, 120_4, and 120_5.

The first_first gate electrode 120_1 may overlap the first sidewall 110_s1 of the first lower pattern 110 in the second direction D2 by a first_first depth d11 from the top surface 110us of the first lower pattern 110 (e.g., a distance from the top surface 110us of the first lower pattern 110 in the third direction D3). The first_first gate electrode 120_1 may overlap the second sidewall 110_s2 of the first lower pattern in the second direction D2 by a first_second depth d12 from the top surface 110us of the first lower pattern 110. As used herein, "an element A overlapping an element B in a direction X" (or similar language) may mean that at least one line extending in the direction X can be drawn that intersects both the elements A and B.

The first_first gate electrode 120_1 may overlap the first sidewall 210_s1 of the second lower pattern 210 in the second direction D2 by a second_first depth d21 from the top surface 210us of the second lower pattern 210. The first_first gate electrode 120_1 may overlap the second sidewall 210_s2 of the second lower pattern 210 in the second direction D2 by a second_second depth d22 from the top surface 210us of the second lower pattern 210.

The first_first gate electrode 120_1 may include a first portion 120_1a, a second portion 120_1b, and a third portion 120_1c. The first portion 120_1a of the first_first gate electrode may be disposed between the first gate isolation structure GCS1 and a first_first sheet pattern NS1_1. The first portion 120_1a of the first_first gate electrode may be disposed adjacent to the first sidewall 110_s1 of the first lower pattern 110. The second portion 120_1b of the first_first gate electrode may be disposed between the first gate isolation structure GCS1 and a second_first sheet pattern NS2_1. The second portion 120_1b of the first_first gate electrode may be disposed adjacent to the second sidewall 210_s2 of the second lower pattern 210. The third portion 120_1c of the first_first gate electrode may be disposed between the first_first sheet pattern NS1_1 and the second_first sheet pattern NS2_1. The third portion 120_1c of the first_first gate electrode may be disposed adjacent to the second sidewall 110_s2 of the first lower pattern 110 and the first sidewall 210_s1 of the second lower pattern 210.

Here, the first_first depth d11 may be a depth from the top surface 110us of the first lower pattern 110 to the lowermost part of the first portion 120_1a of the first_first gate electrode 120_1. Here, the first_second depth d12 may be a depth from the top surface 110us of the first lower pattern 110 to the lowermost portion of the third portion 120_1c of the first_first gate electrode 120_1. The second_first depth d21 may be a depth from the top surface 210us of the second lower pattern 210 to the lowermost part of the third portion 120_1c of the first_first gate electrode 120_1. In some embodiments, the first portion 120_1a of the first_first gate electrode 120_1 may protrude beyond the top surface 110us of the first lower pattern 110 toward the substrate 100 by the first_first depth d11, and the third portion 120_1c of the first_first gate electrode 120_1 may protrude beyond the top surface 110us of the first lower pattern 110 toward the substrate 100 by the first_second depth d12 as illustrated in FIG. 4A. Further, the second portion 120_1b of the first_first gate electrode 120_1 may protrude beyond the top surface 210us of the second lower pattern 210 toward the substrate 100 by the second_second depth d22, and the third portion 120_1c of the first_first gate electrode 120_1 may protrude beyond the top surface 210us of the second lower pattern 210 toward the substrate 100 by the second_first depth d21 as illustrated in FIG. 4A.

For example, the first_first depth d11 may be different from the first_second depth d12. In addition, the second_first depth d21 may be different from the second_second depth d22. That is, the depths of the first_first gate electrode 120_1 descending from the top surface 110us of the first lower pattern along both sidewalls of the first lower pattern 110 may be asymmetric. The depths of the first_first gate electrode 120_1 descending from the top surface 210us of the second lower pattern along both sidewalls of the second lower pattern 210 may be asymmetric.

In the semiconductor device according to some embodiments, the first_first depth d11 is smaller than the first_second depth d12, and the second_second depth d22 is smaller than the second_first depth d21.

Since the first_first depth d11 is smaller than the first_second depth d12, the capacitance between the first gate electrode 120_1, 120_2, 120_3, 120_4, 120_5 and the first epitaxial pattern 150 may decrease. In addition, since the second_second depth d22 is smaller than the second_first depth d21, the capacitance between the first gate electrode 120_1, 120_2, 120_3, 120_4, 120_5 and the second epitaxial pattern 250 may decrease. As a result, performance and reliability of the semiconductor device may be improved.

In the semiconductor device according to some embodiments, the first_first depth d11 may be equal to the second_second depth d22. The first_second depth d21 may be equal to the first_second depth d12.

In other words, between the first gate isolation structure GCS1 and the first lower pattern 110, as a width w11 of the first_first gate electrode 120_1 in the second direction D2 decreases, the first_first depth d11 may decrease. Between the first lower pattern 110 and the second lower pattern 210, as a width w13 of the first_first gate electrode 120_1 in the second direction D2 increases, the first_second depth d12 and the second_first depth d21 may increase.

Here, the width w11 of the first_first gate electrode 120_1 between the first gate isolation structure GCS1 and the first lower pattern 110 may be measured based on or at a level of the top surface 110us of the first lower pattern as illustrated in FIG. 4A.

In the semiconductor device according to some embodiments, the width w13 of the first_first gate electrode 120_1 between the first lower pattern 110 and the second lower pattern 210 is greater than the width w11 of the first_first gate electrode 120_1 between the first gate isolation structure GCS1 and the first lower pattern 110. In addition, the width w13 of the first_first gate electrode 120_1 between the first lower pattern 110 and the second lower pattern 210 is greater than a width w12 of the first_first gate electrode 120_1 between the first gate isolation structure GCS1 and the second lower pattern 210.

The first interlayer insulating layer 191 may be disposed above the field insulating layer 105. The first interlayer insulating layer 191 may cover the sidewall of the first gate electrode 120_1, 120_2, 120_3, 120_4, 120_5. The first interlayer insulating layer 191 may be disposed on the first epitaxial pattern 150 and the second epitaxial pattern 250.

A second interlayer insulating layer 192 may be disposed on the first interlayer insulating layer 191. Each of the first interlayer insulating layer 191 and the second interlayer insulating layer 192 may include, for example, silicon oxide, silicon nitride, silicon oxynitride, flowable oxide (FOX), tonen silazene (TOSZ), undoped silicate glass (USG), borosilicate glass (BSG), phosphosilicate glass (PSG), borophosphosilicate glass (BPS G), plasma enhanced tetra ethyl ortho silicate (PETEOS), fluoride silicate glass (FSG), carbon doped silicon oxide (CDO), Xerogel, Aerogel, amorphous fluorinated carbon, organo silicate glass (OSG), parylene, bis-benzocyclobutene (BCB), SILK, polyimide, a porous polymeric material, or a combination thereof, but is not limited thereto.

The wiring line 195 may be disposed in the second interlayer insulating layer 192. The wiring line 195 may extend in the first direction D1 along the first gate isolation structure GCS1.

For example, the wiring line 195 may be a power lane that supplies power to an integrated circuit including the first active pattern AP1, the second active pattern AP2, and the first gate electrodes 120_1, 120_2, 120_3, 120_4, and 120_5. The wiring line 195 may include, for example, at least one of a metal, a metal alloy, a conductive metal nitride, or a two-dimensional (2D) material.

Although not shown, between the two first gate isolation structures GCS1 spaced apart from each other in the second direction D2, additional wirings are further disposed to transmit signals to the integrated circuit including the first active pattern AP1, the second active pattern AP2, and the first gate electrodes 120_1, 120_2, 120_3, 120_4, and 120_5.

Unlike the illustrated example, in some embodiments, the wiring line 195 may contact the top surface of the first gate isolation structure GCS1 and/or the top surface of the first gate capping pattern 145.

Figure 6:
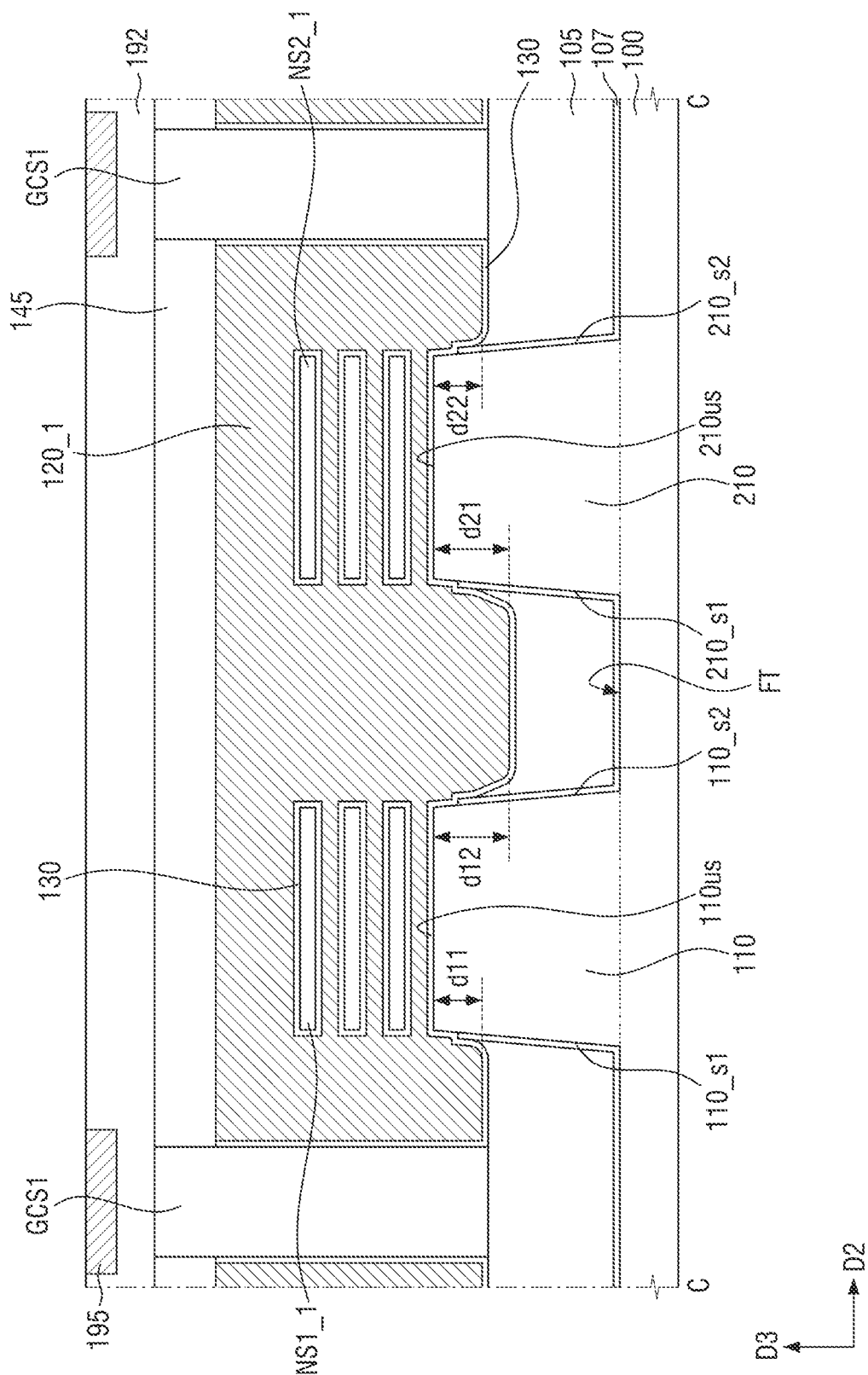
FIG. 6 is a cross-sectional view of a semiconductor device according to some embodiments of the present inventive concept.

FIG. 6 is a cross-sectional view of a semiconductor device according to some embodiments of the present inventive concept. For simplicity of description, the following description may focus on differences from the description provided with reference to FIGS. 1 to 5B.

Referring to FIG. 6, the semiconductor device according to some embodiments may further include a fin liner 107 extending along the sidewall and the bottom surface of the fin trench FT.

The fin liner 107 may extend along at least a portion (e.g., a lower portion) of the first sidewall 110_s1 of the first lower pattern 110, at least a portion (e.g., a lower portion) of the second sidewall 110_s2 of the first lower pattern 110, at least a portion (e.g., a lower portion) of the first sidewall 210_s1 of the second lower pattern 210, and at least a portion (e.g., a lower portion) of the second sidewall 210_s2 of the second lower pattern 210.

For example, the fin liner 107 may not cover a portion (e.g., an upper portion) of the first sidewall 110_s1 of the first lower pattern 110, a portion (e.g., an upper portion) of the second sidewall 110_s2 of the first lower pattern 110, a portion (e.g., an upper portion) of the first sidewall 210_s1 of the second lower pattern 210, and a portion (e.g., an upper portion) of the second sidewall 210_s2 of the second lower pattern 210.

For example, a portion of the first lower pattern 110 and/or a portion of the second lower pattern 210 may protrude upwardly beyond the uppermost portion of the fin liner 107.

In addition, a portion of the fin liner 107 may protrude upwardly in the third direction D3 beyond the top surface of the field insulating layer 105. That is, a portion (e.g., an upper portion) of the fin liner 107 may not be covered by the field insulating layer 105.

Unlike the illustrated example, in some embodiments, the fin liner 107 may entirely cover the first sidewall 110_s1 of the first lower pattern 110, the second sidewall 110_s2 of the first lower pattern 110, the first sidewall 210_s1 of the second lower pattern 210, and the second sidewall 210_s2 of the second lower pattern 210.

Unlike the illustrated example, in some embodiments, the fin liner 107 may be entirely covered by the field insulating layer 105.

The fin liner 107 may include, for example, at least one of silicon oxide, silicon oxynitride, or silicon nitride.

Figure 7:
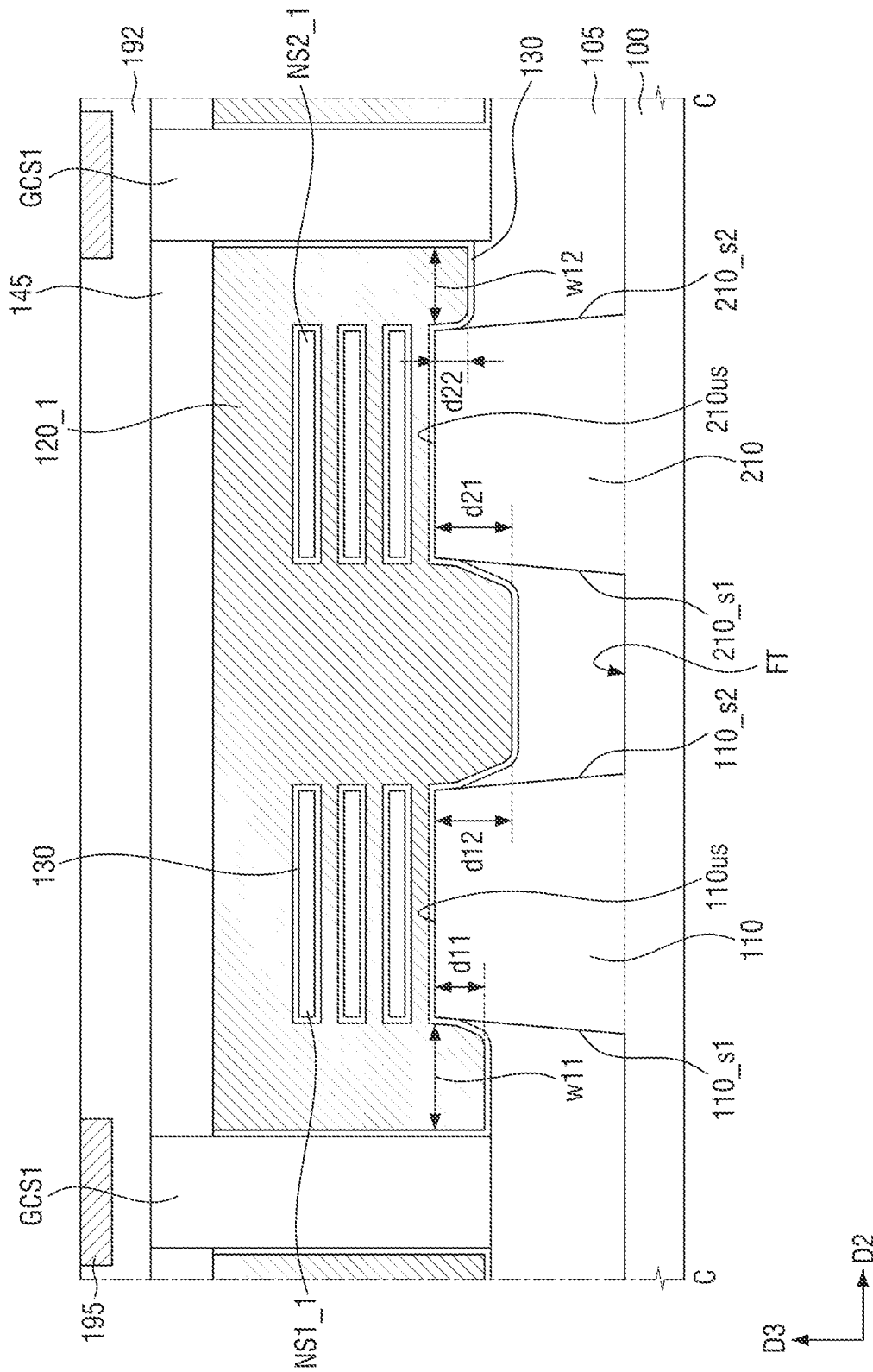
FIG. 7 is a cross-sectional view of a semiconductor device according to some embodiments of the present inventive concept.

FIG. 7 is a cross-sectional view of a semiconductor device according to some embodiments of the present inventive concept. For simplicity of description, the following description will focus on differences from the description provided with reference to FIGS. 1 to 5B.

Referring to FIG. 7, in the semiconductor device according to some embodiments, the first_first depth d11 may be different from the second_second depth d22.

The first_first depth d11 may be greater than the second_second depth d22. The first_first depth d11 is smaller than the first_second depth d12 and the second_first depth d21.

The first_first depth d11 is related to the width w11 of the first_first gate electrode 120_1 between the first gate isolation structure GCS1 and the first lower pattern 110. Accordingly, the width w11 of the first_first gate electrode 120_1 between the first gate isolation structure GCS1 and the first lower pattern 110 is smaller than the width w12 of the first_first gate electrode 120_1 between the first gate isolation structure GCS1 and the second lower pattern 210.

Figure 8:
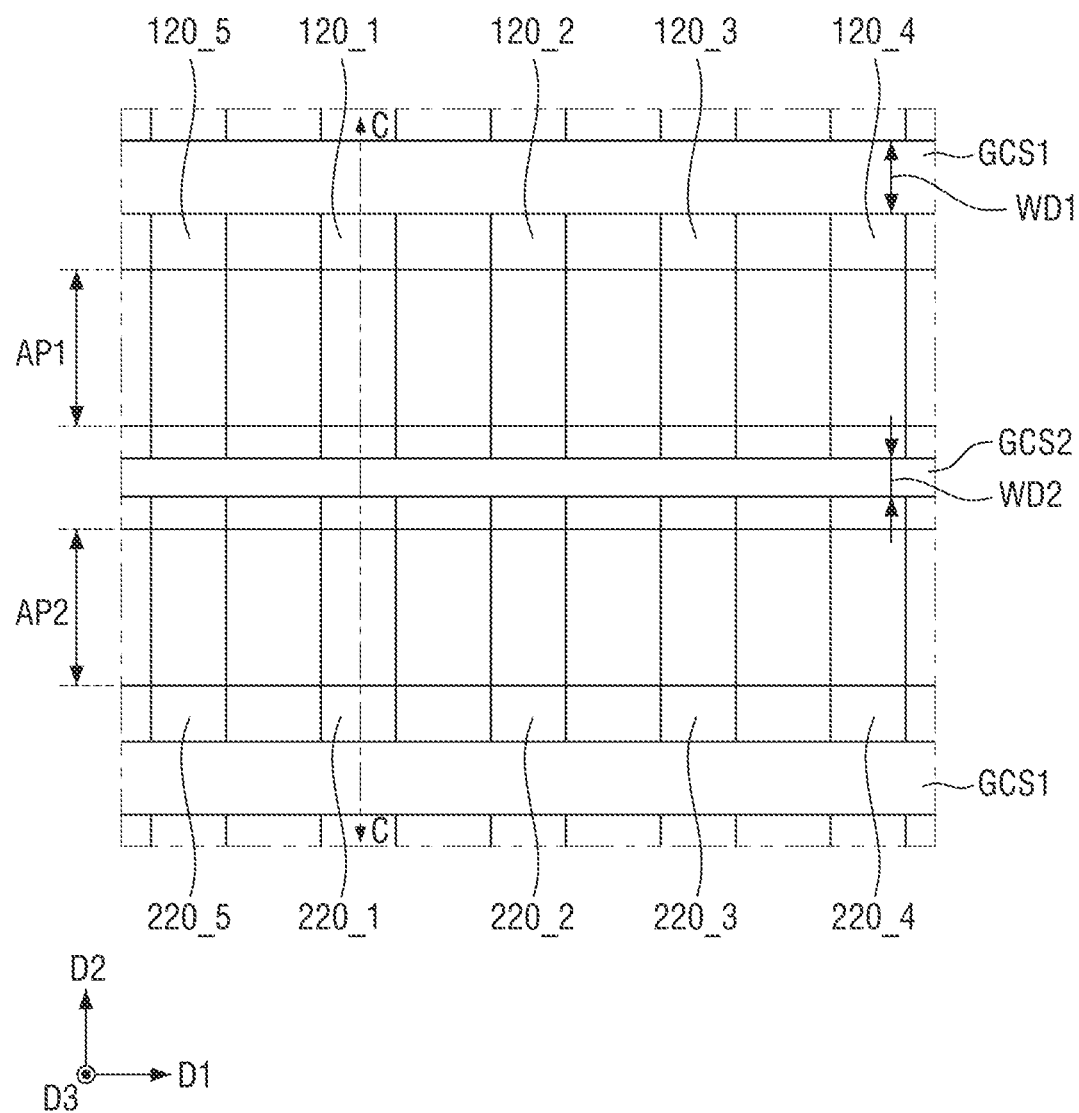
FIG. 8 is a layout diagram illustrating a semiconductor device according to some embodiments of the present inventive concept.
Figure 9:
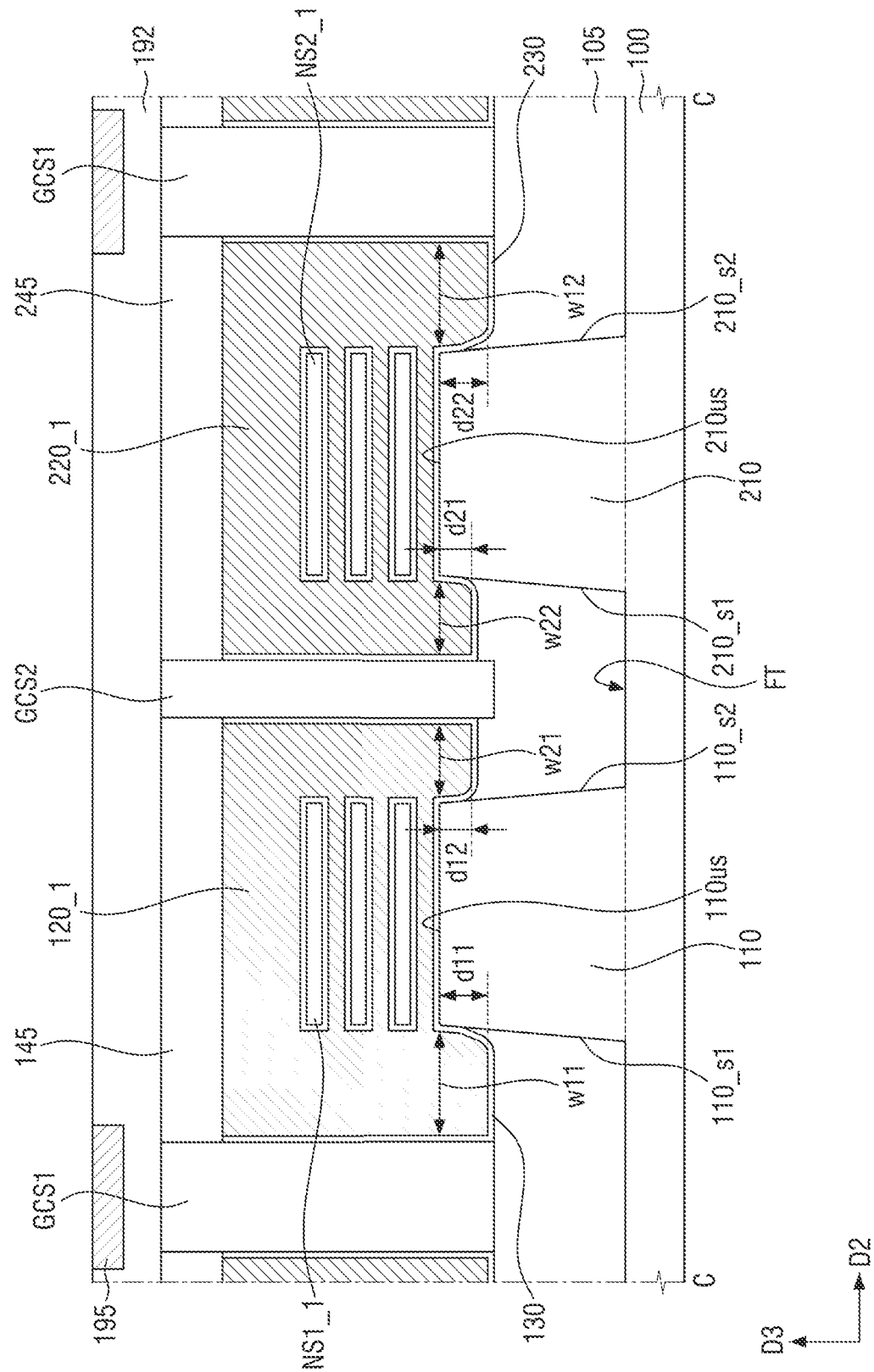
FIG. 9 is a cross-sectional view taken along line C-C of FIG. 8 according to some embodiments of the present inventive concept.

FIG. 8 is a layout diagram illustrating a semiconductor device according to some embodiments of the present inventive concept. FIG. 9 is a cross-sectional view taken along line C-C of FIG. 8. For simplicity of description, the following description will focus on differences from the description provided with reference to FIGS. 1 to 5B.

Referring to FIGS. 8 and 9, the semiconductor device according to some embodiments may further include a second gate isolation structure GCS2 disposed between the two first gate isolation structures GCS1.

The second gate isolation structure GCS2 may be disposed above the substrate 100. The second gate isolation structure GCS2 may be disposed on the field insulating layer 105.

The second gate isolation structure GCS2 may be disposed between the first active pattern AP1 and the second active pattern AP2. The second gate isolation structure GCS2 may be disposed between the first lower pattern 110 and the second lower pattern 210.

The second gate isolation structure GCS2 is disposed closer to the second sidewall 110_s2 of the first lower pattern 110 than to the first sidewall 110_s1 of the first lower pattern 110. The second gate isolation structure GCS2 is disposed closer to the first sidewall 210_s1 of the second lower pattern 210 than to the second sidewall 210_s2 of the second lower pattern 210.

The top surface of the second gate isolation structure GCS2 may lie on the same plane as the top surface of the first gate isolation structure GCS1. The top surface of the second gate isolation structure GCS2 and the top surface of the first gate isolation structure GCS1 may be at the same level from the substrate 100.

In the semiconductor device according to some embodiments, the second gate isolation structure GCS2 may be disposed within the standard cell.

A cross-sectional view of the second gate isolation structure GCS2 taken in the first direction D1 may be similar to the shapes of the first gate isolation structure GCS1 described with reference to FIG. 5A or 5B.

The second gate isolation structure GCS2 may include, for example, at least one of silicon nitride (SiN), silicon oxynitride (SiON), silicon oxide (SiO₂), silicon oxynitride (SiOCN), silicon boron nitride (SiBN), silicon oxyboron nitride (SiOBN), silicon oxycarbide (SiOC), aluminum oxide (AlO), or a combination thereof. The second gate isolation structure GCS is illustrated as a single layer, but is not limited thereto.

For example, a width WD1 of the first gate isolation structure GCS1 in the second direction D2 may be greater than or equal to a width WD2 of the second gate isolation structure GCS2 in the second direction D2.

Each of the first gate electrodes 120_1, 120_2, 120_3, 120_4, and 120_5 may be disposed between the first gate isolation structure GCS1 and the second gate isolation structure GCS2. Each of the first gate electrodes 120_1, 120_2, 120_3, 120_4, and 120_5 may cross or traverse the first active pattern AP1. However, each of the first gate electrodes 120_1, 120_2, 120_3, 120_4, and 120_5 does not cross or traverse the second active pattern AP2.

The first gate insulating layer 130 may extend along the sidewall of the second gate isolation structure GCS2.

Each of second gate electrodes 220_1, 220_2, 220_3, 220_4, and 220_5 may be disposed between the first gate isolation structure GCS1 and the second gate isolation structure GCS2. Each of the second gate electrodes 220_1, 220_2, 220_3, 220_4, and 220_5 may extend in the second direction D2. The second gate electrodes 220_1, 220_2, 220_3, 220_4, and 220_5 may be spaced apart in the first direction D1.

Each of the second gate electrodes 220_1, 220_2, 220_3, 220_4, and 220_5 may cross or traverse the second active pattern AP2. However, each of the second gate electrodes 220_1, 220_2, 220_3, 220_4, and 220_5 does not cross or traverse the first active pattern AP1.

Each of the second gate electrodes 220_1, 220_2, 220_3, 220_4, and 220_5 may be disposed above the second lower pattern 210. The second gate electrodes 220_1, 220_2, 220_3, 220_4, and 220_5 may respectively surround of the second sheet patterns NS2_1, NS2_2, NS2_3, NS2_4, and NS2_5.

By the second gate isolation structure GCS2, the first gate electrodes 120_1, 120_2, 120_3, 120_4, and 120_5 may be separated from the second gate electrodes 220_1, 220_2, 220_3, 220_4, and 220_5. The first gate electrodes 120_1, 120_2, 120_3, 120_4, and 120_5 and the second gate electrodes 220_1, 220_2, 220_3, 220_4, and 220_5 corresponding to each other may be spaced apart in the second direction D2. The second gate isolation structure GCS2 may be disposed between the first gate electrodes 120_1, 120_2, 120_3, 120_4, and 120_5 and the second gate electrodes 220_1, 220_2, 220_3, 220_4, and 220_5. In some embodiments, each of the first gate electrodes 120_1, 120_2, 120_3, 120_4, and 120_5 may be colinear with a respective one of the second gate electrodes 220_1, 220_2, 220_3, 220_4, and 220_5 as illustrated in FIG. 8.

A second gate insulating layer 230 may extend along the top surface of the field insulating layer 105 and the top surface 210us of the second lower pattern 210. The second gate insulating layer 230 may wrap each of the second sheet patterns NS2_1, NS2_2, NS2_3, NS2_4, and NS2_5. The second gate insulating layer 230 may extend along the sidewall of the first gate isolation structure GCS1 and the sidewall of the second gate isolation structure GCS2. The second gate electrode 220_1, 220_2, 220_3, 220_4, 220_5 may be disposed on the second gate insulating layer 230.

The second gate electrode 220_1, 220_2, 220_3, 220_4, 220_5 may include, for example, at least one of a metal, a metal alloy, a conductive metal nitride, a metal silicide, a doped semiconductor material, a conductive metal oxide, or a conductive metal oxynitride. The second gate insulating layer 230 may include, for example, silicon oxide, silicon oxynitride, silicon nitride, or a high-k material having a higher dielectric constant than silicon oxide.

A second gate capping pattern 245 may be disposed on the second gate electrode 220_1, 220_2, 220_3, 220_4, 220_5. The top surface of the second gate capping pattern 245 may lie on the same plane as the top surface of the first gate capping pattern 145. The top surface of the second gate capping pattern 245 and the top surface of the first gate capping pattern 145 may be at the same level from the substrate 100.

The second gate capping pattern 245 may include, for example, at least one of silicon nitride (SiN), silicon oxynitride (SiON), silicon oxide (SiO₂), silicon carbonitride (SiCN), silicon oxycarbonitride (SiOCN), or a combination thereof.

The following description will be made using one second_first gate electrode 220_1, but it may also be applicable to the other second gate electrodes 220_2, 220_3, 220_4, and 220_5.

The second_first gate electrode 220_1 may overlap the first sidewall 210_s1 of the second lower pattern 210 in the second direction D2 by the second_first depth d21 from the top surface 210us of the second lower pattern 210. The second_first gate electrode 220_1 may overlap the second sidewall 210_s2 of the second lower pattern in the second direction D2 by the second_second depth d22 from the top surface 210us of the second lower pattern.

For example, the first_first depth d11 may be different from the first_second depth d12. Further, the second_first depth d21 may be different from the second_second depth d22.

In the semiconductor device according to some embodiments, the first_first depth d11 is greater than the first_second depth d12, and the second_second depth d22 is greater than the second_first depth d21.

In the semiconductor device according to some embodiments, the first_first depth d11 may be equal to the second_second depth d22. The second_first depth d21 may be equal to the first_second depth d12.

In the semiconductor device according to some embodiments, the width w11 of the first_first gate electrode 120_1 between the first lower pattern 110 and the first gate isolation structure GCS1 is greater than a width w21 of the first_first gate electrode 120_1 between the second gate isolation structure GCS2 and the first lower pattern 110. In addition, the width w12 of the second_first gate electrode 220_1 between the second lower pattern 210 and the first gate isolation structure GCS1 is greater than a width w22 of the second_first gate electrode 220_1 between the second gate isolation structure GCS2 and the second lower pattern 210.

Figure 10:
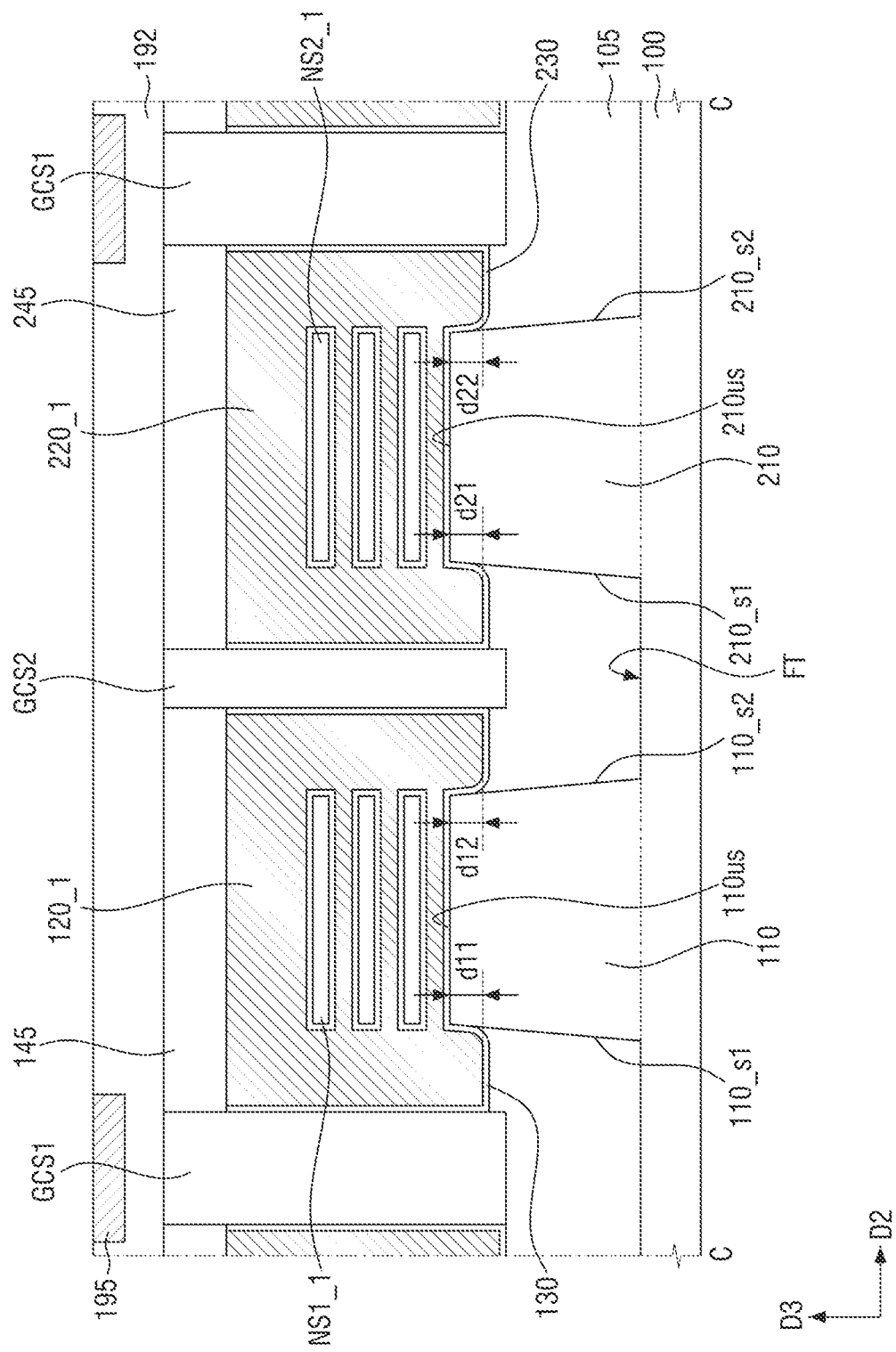
FIG. 10 is a cross-sectional view of a semiconductor device according to some embodiments of the present inventive concept.
Figure 11:
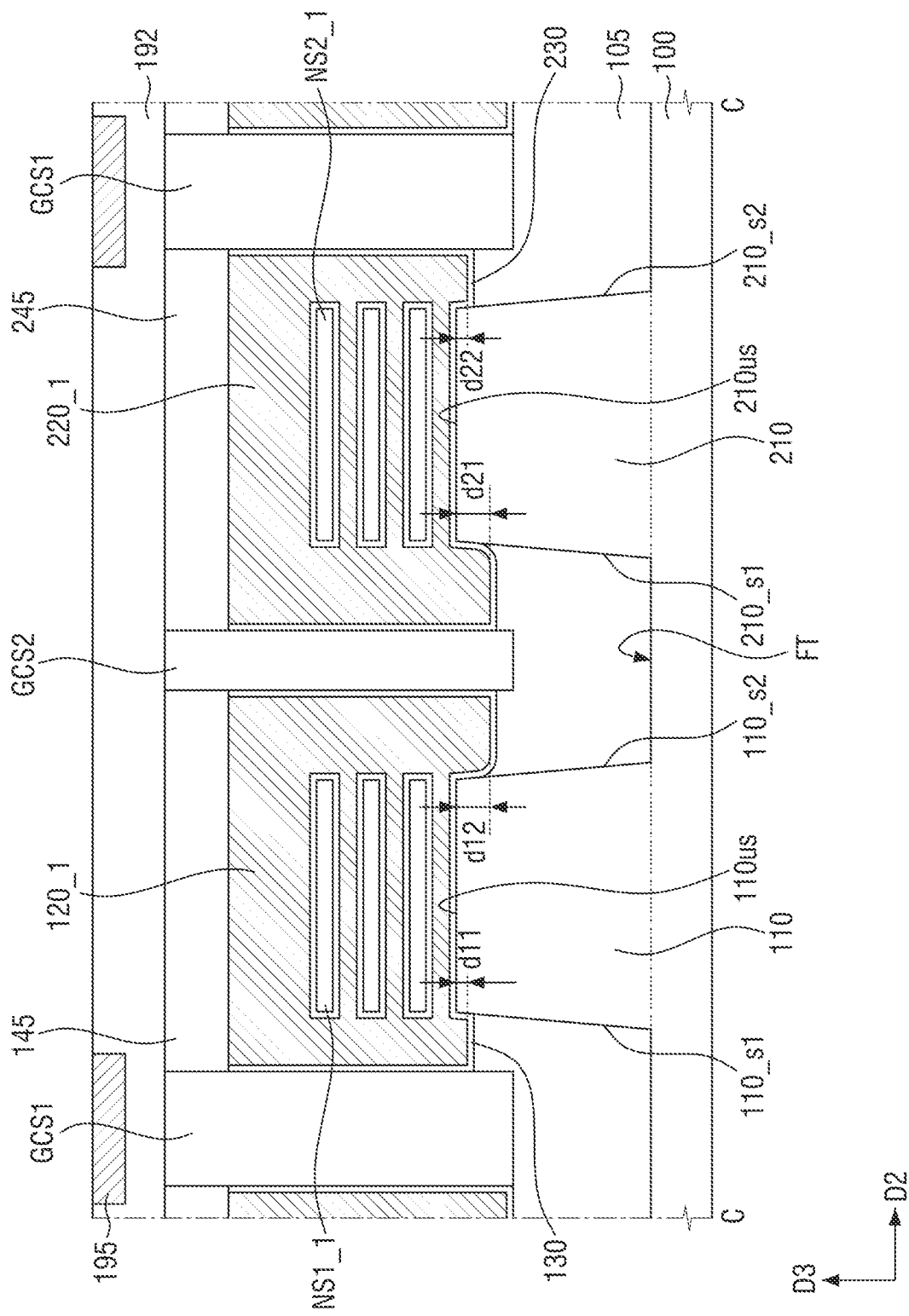
FIG. 11 is a cross-sectional view of a semiconductor device according to some embodiments of the present inventive concept.
Figure 12:
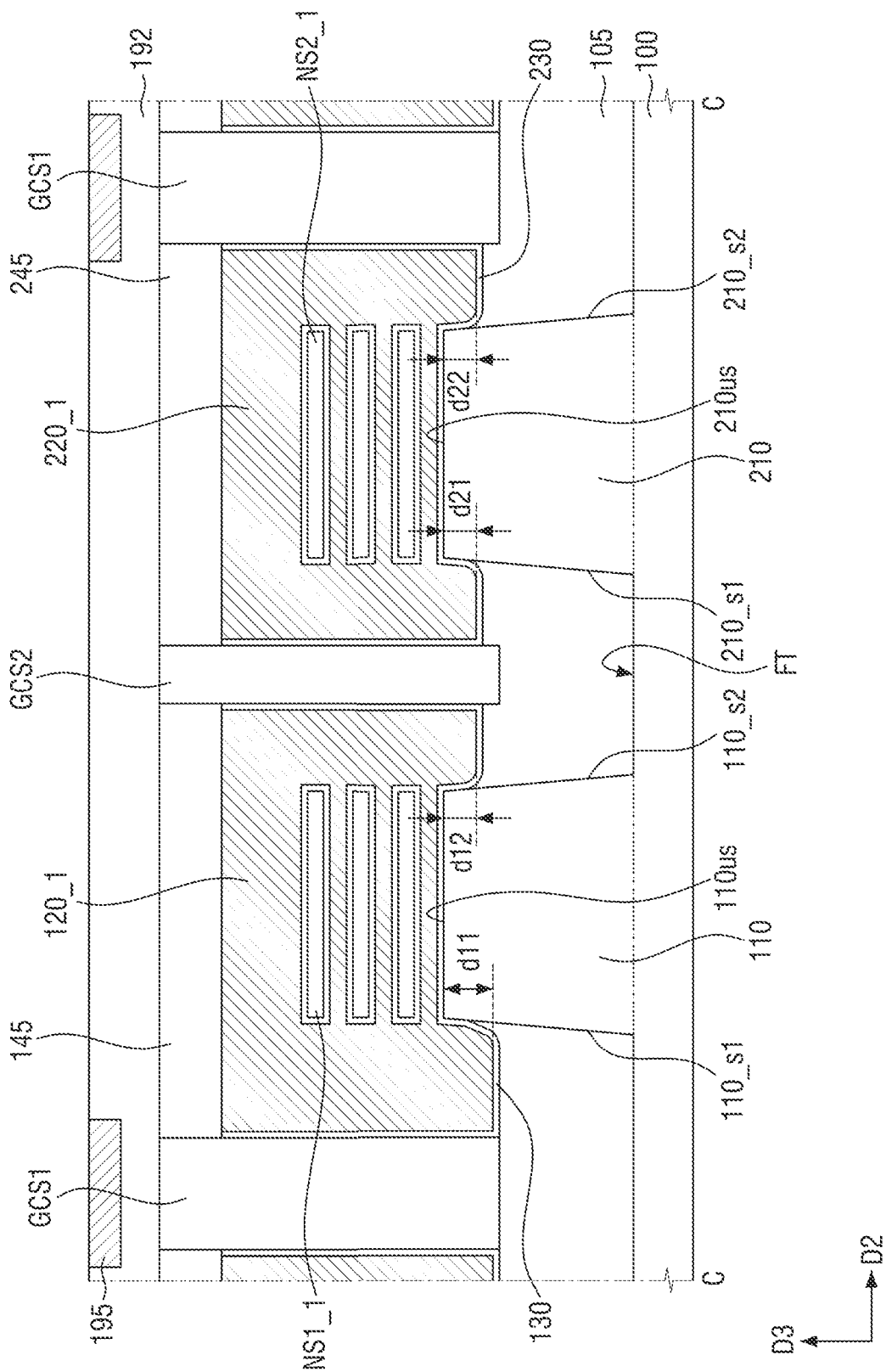
FIG. 12 is a cross-sectional view of a semiconductor device according to some embodiments of the present inventive concept.
Figure 13:
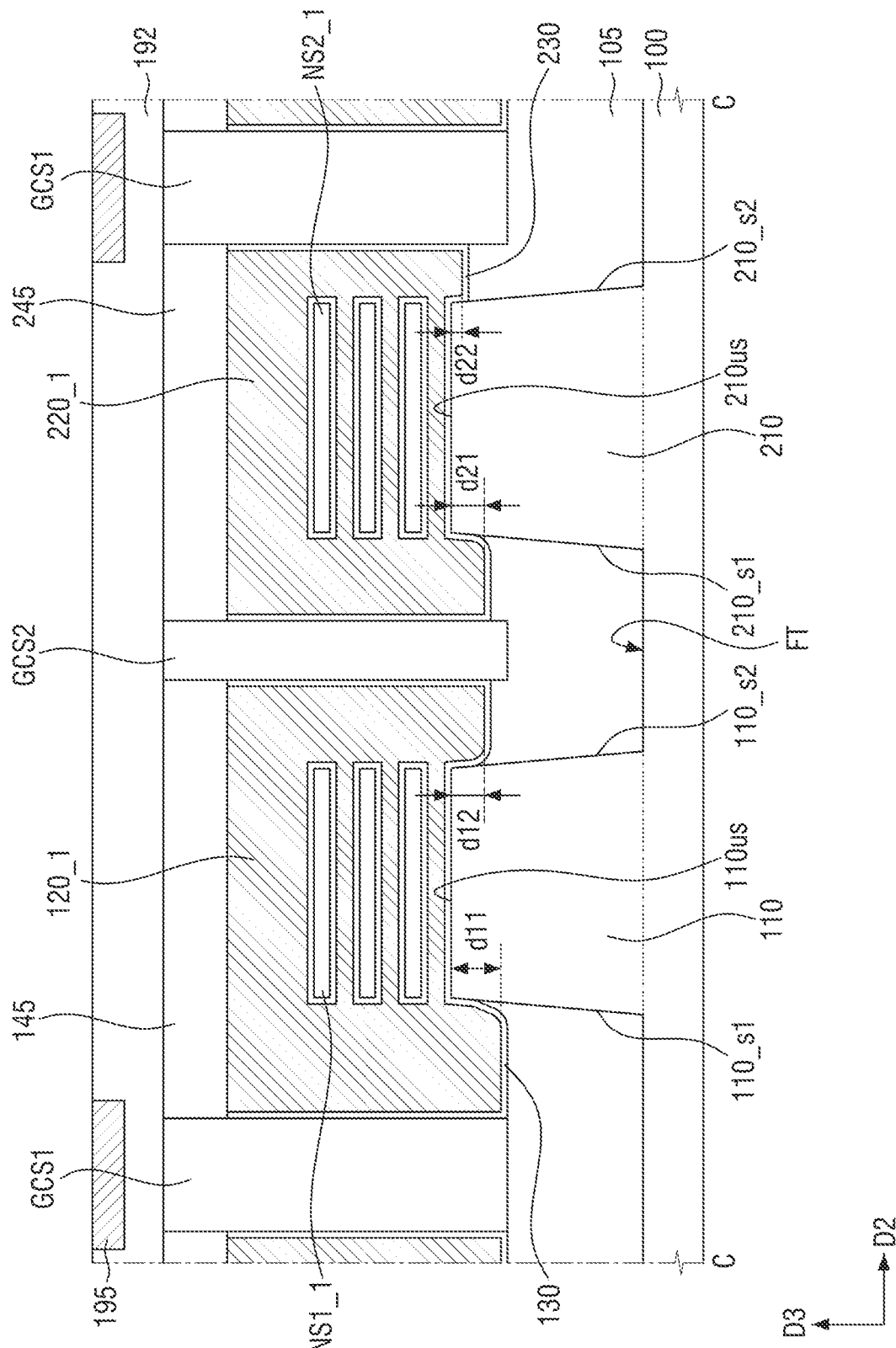
FIG. 13 is a cross-sectional view of a semiconductor device according to some embodiments of the present inventive concept.

FIG. 10 is a cross-sectional view of a semiconductor device according to some embodiments of the present inventive concept. FIG. 11 is a cross-sectional view of a semiconductor device according to some embodiments of the present inventive concept. FIG. 12 is a cross-sectional view of a semiconductor device according to some embodiments of the present inventive concept. FIG. 13 is a cross-sectional view of a semiconductor device according to some embodiments of the present inventive concept. For simplicity of description, the following description will focus on differences from the description provided with reference to FIGS. 8 and 9.

Referring to FIG. 10, in the semiconductor device according to some embodiments, the first_first depth d11 may be equal to the first_second depth d12. In addition, the second_second depth d22 may be equal to the second_first depth d21.

In other words, the first_first depth d11, the first_second depth d12, the second_first depth d21, and the second_second depth d22 may be the same as each other.

Referring to FIG. 11, in the semiconductor device according to some embodiments, the first_first depth d11 is smaller than the first_second depth d12. In addition, the second_second depth d22 is smaller than the second_first depth d21.

The first_first depth d11 may be equal to the second_second depth d22. The second_first depth d21 may be equal to the first_second depth d12.

Referring to FIG. 12, in the semiconductor device according to some embodiments, the first_first depth d11 may be different from the second_second depth d22. For example, the first_first depth d11 is greater than the second_second depth d22.

The first_first depth d11 is greater than the first_second depth d12. The second_second depth d22 may be equal to the second_first depth d21. The first_second depth d12 is equal to the second_first depth d21 and the second_second depth d22.

Referring to FIG. 13, in the semiconductor device according to some embodiments, the first_first depth d11 is greater than the second_second depth d22. The second_second depth d22 is smaller than the second_first depth d21.

The second_first depth d21 may be equal to the first_second depth d12. The first_second depth d12 and the second_first depth d21 are smaller than the first_first depth d11 and greater than the second_second depth d22.

Figure 14:
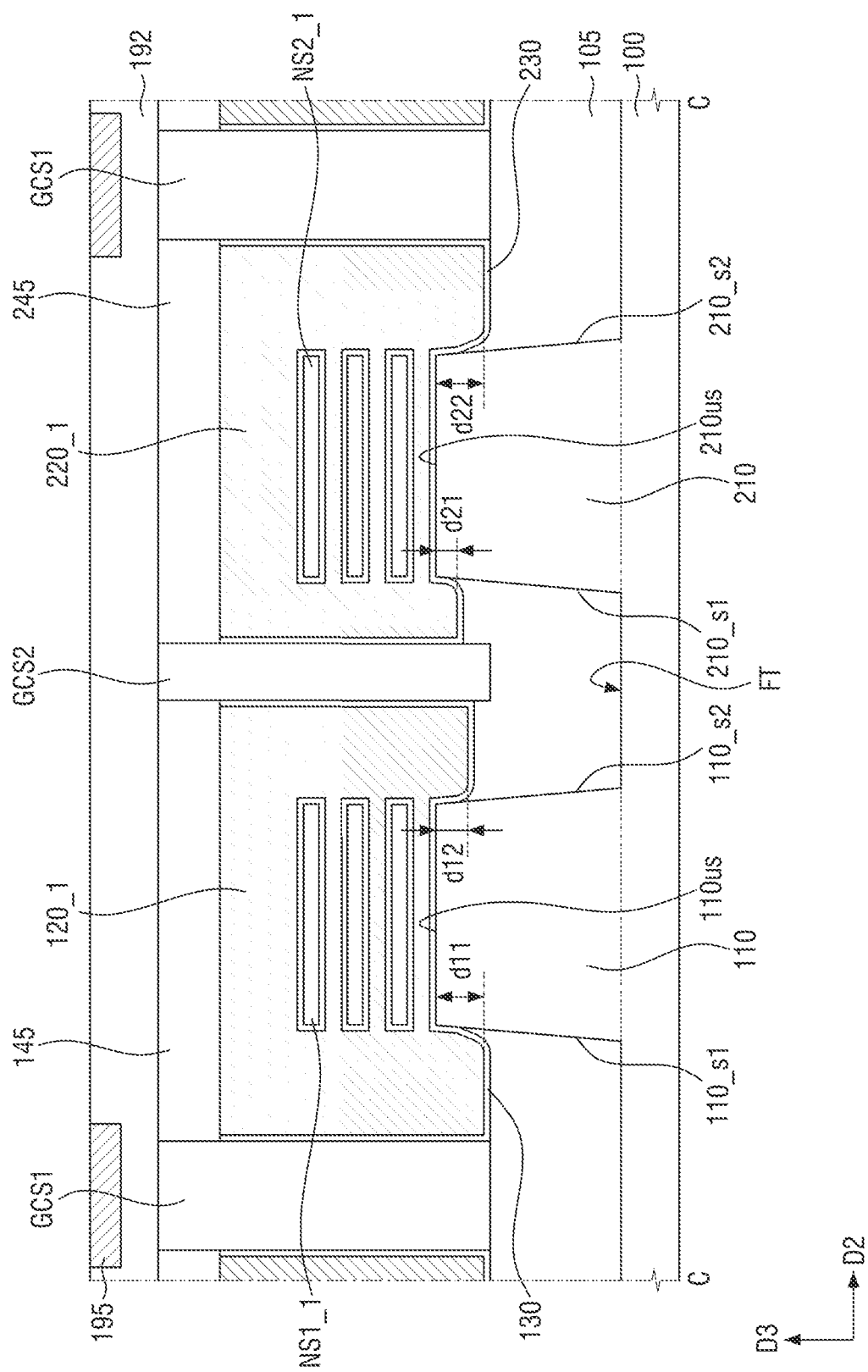
FIG. 14 is a cross-sectional view of a semiconductor device according to some embodiments of the present inventive concept.

FIG. 14 is a cross-sectional view of a semiconductor device according to some embodiments of the present inventive concept. For simplicity of description, the following description will focus on differences from the description provided with reference to FIGS. 8 and 9.

Referring to FIG. 14, in the semiconductor device according to some embodiments, the second_first depth d21 may be different from the first_second depth d12.

For example, the second_first depth d21 may be smaller than the first_second depth d12. The second gate isolation structure GCS2 may be closer to the second_first sheet pattern NS2_1 than to the first_first sheet pattern NS1_1.

For example, the first_first depth d11 may be equal to the second_second depth d22. The first_first depth d11 may be greater than the second_first depth d21 and the first_second depth d12.

Although not shown, in some embodiments, the first_first depth d11 may be equal to the first_second depth d12. In some embodiments, the first_first depth d11 may be smaller than the first_second depth d12 and greater than the second_first depth d21. In some embodiments, the first_first depth d11 may be equal to the second_first depth d21. In some embodiments, the first_first depth d11 may be smaller than the second_first depth d21.

Figure 15:
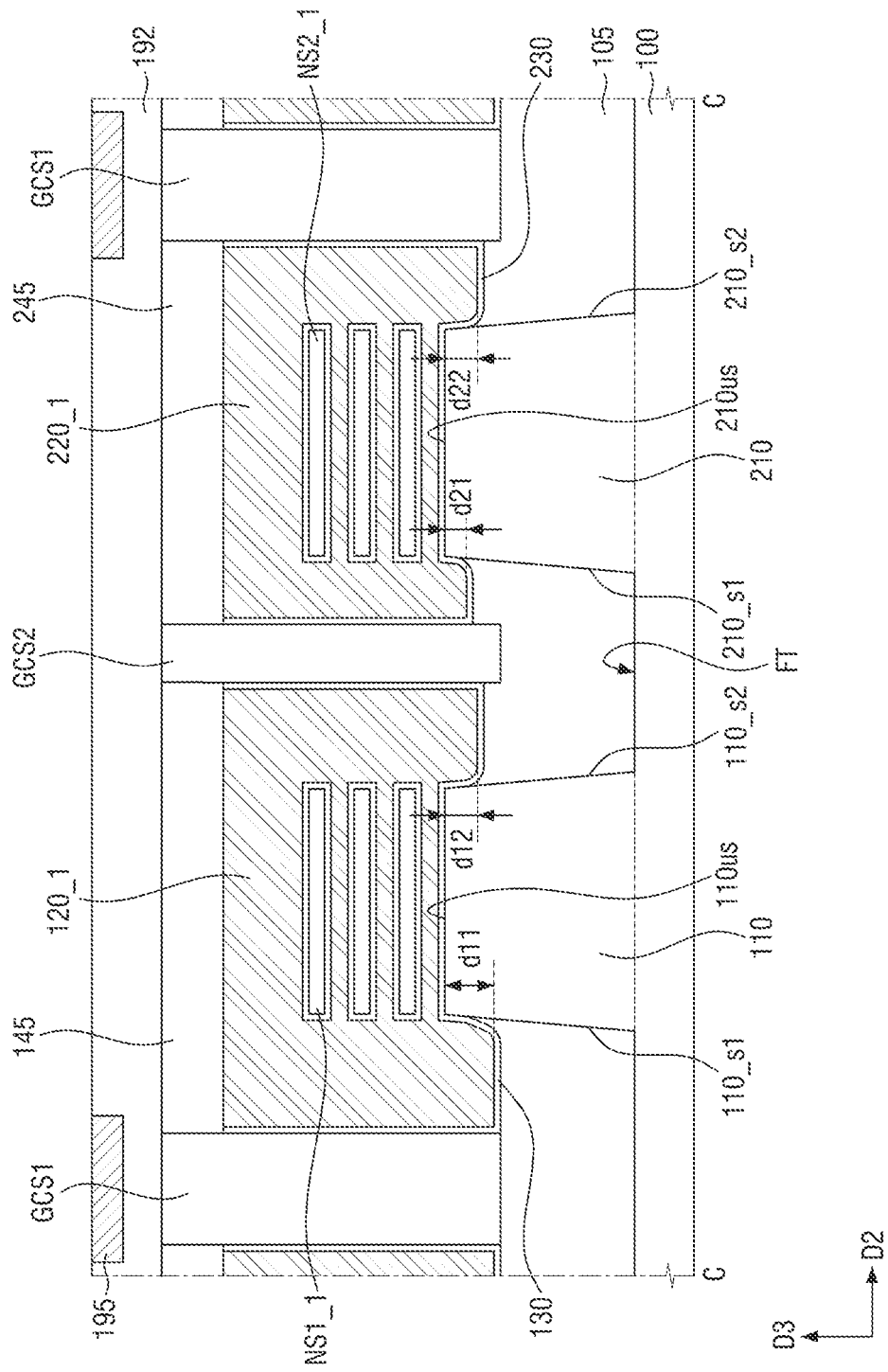
FIG. 15 is a cross-sectional view of a semiconductor device according to some embodiments of the present inventive concept.

FIG. 15 is a cross-sectional view of a semiconductor device according to some embodiments of the present inventive concept. For simplicity of description, the following description will focus on differences from the description provided with reference to FIG. 14.

Referring to FIG. 15, in the semiconductor device according to some embodiments, the second_first depth d21 is smaller than the first_second depth d12.

The first_first depth d11 may be different from the second_second depth d22. For example, the first_first depth d11 may be greater than the second_second depth d22.

The second_first depth d21 may be different from the second_second depth d22. For example, the second_first depth d21 may be smaller than the second_second depth d22. The second_second depth d22 may be smaller than the first_second depth d12.

Unlike the illustrated example, in some embodiments, the second_second depth d22 may be greater than the first_second depth d12. In some embodiments, the second_second depth d22 may be equal to or smaller than the second_first depth d12. Further, in some embodiments, the first_first depth d11 may be smaller than the second_second depth d22.

Figure 16:
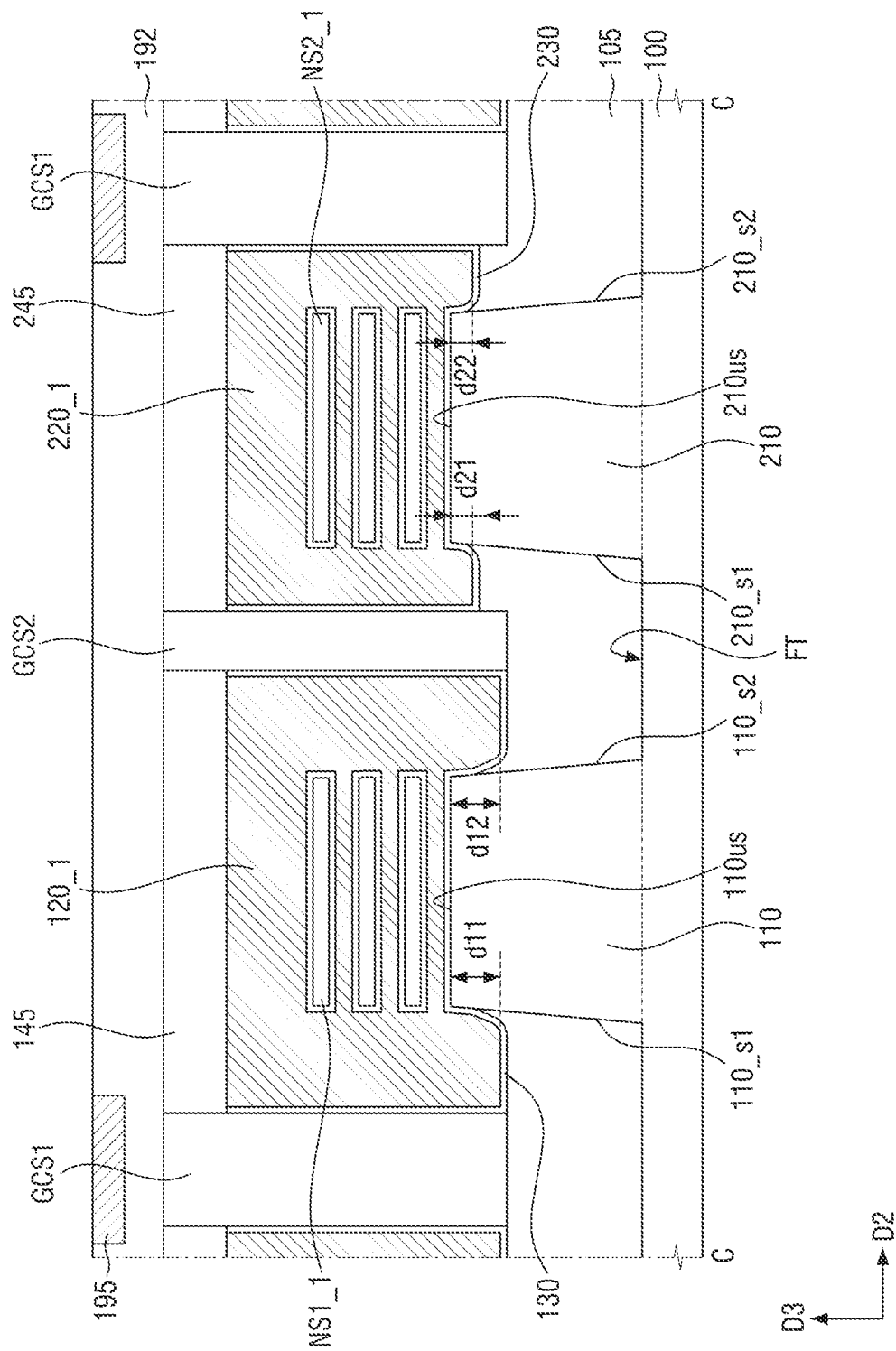
FIG. 16 is a cross-sectional view of a semiconductor device according to some embodiments of the present inventive concept.

FIG. 16 is a cross-sectional view of a semiconductor device according to some embodiments of the present inventive concept. For simplicity of description, the following description will focus on differences from the description provided with reference to FIG. 14.

Referring to FIG. 16, in the semiconductor device according to some embodiments, the second_first depth d21 is smaller than the first_second depth d12.

The first_first depth d11 may be equal to the first_second depth d12. The second_first depth d21 may be equal to the second_second depth d22.

Figure 17:
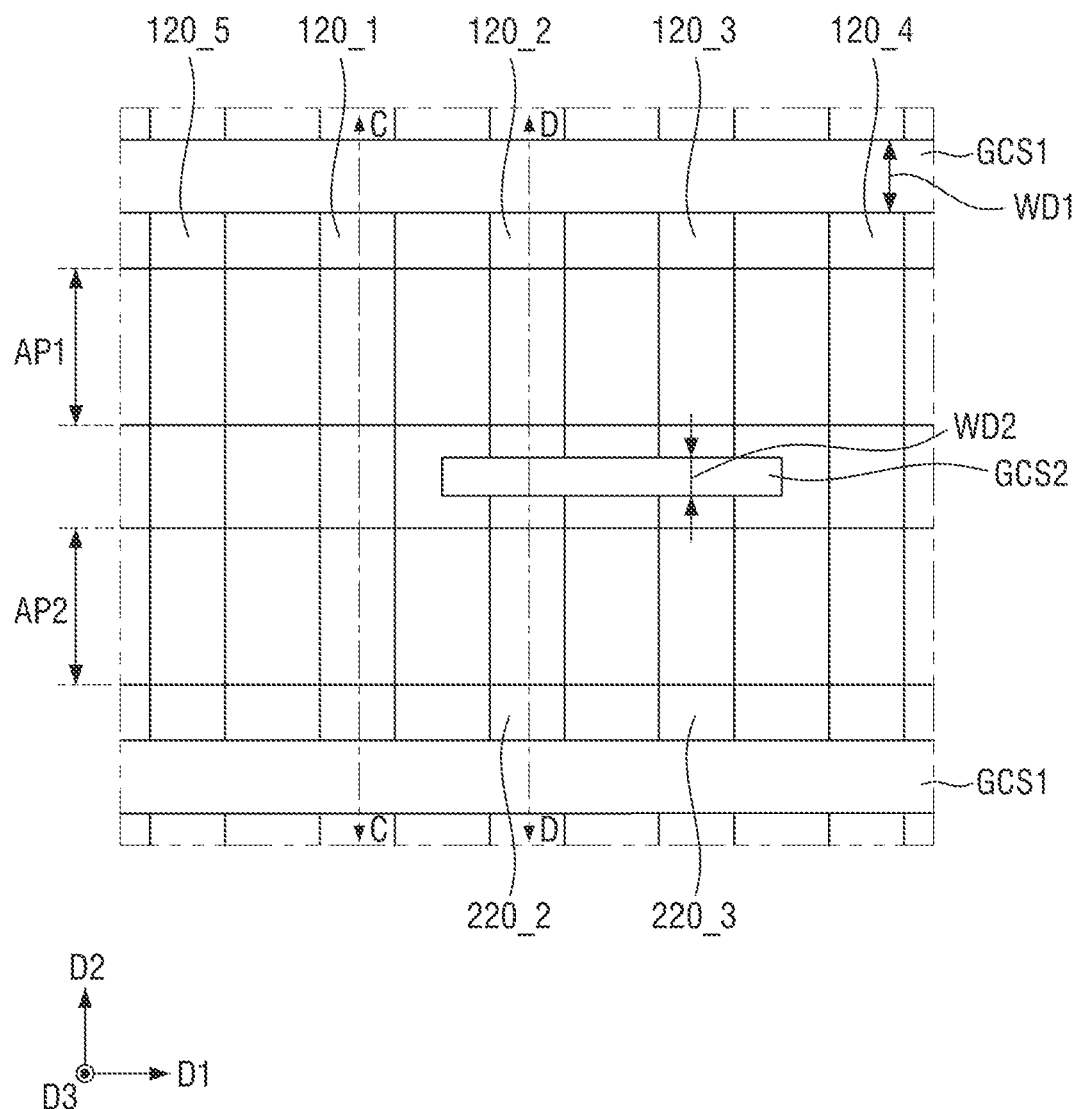
FIG. 17 is a layout diagram illustrating a semiconductor device according to some embodiments of the present inventive concept.
Figure 18:
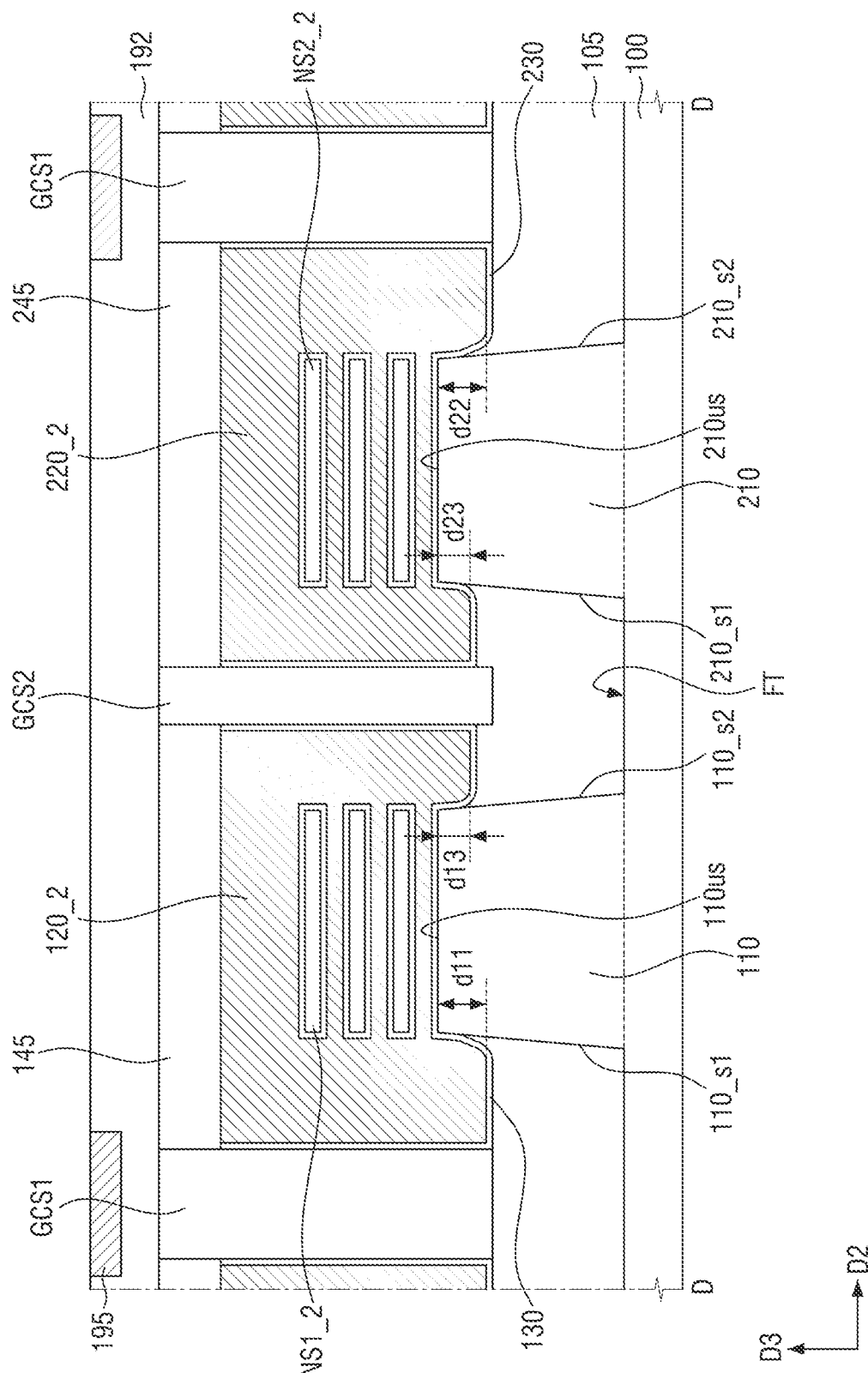
FIG. 18 is a cross-sectional view taken along line D-D of FIG. 17 according to some embodiments of the present inventive concept.

FIG. 17 is a layout diagram illustrating a semiconductor device according to some embodiments of the present inventive concept. FIG. 18 is a cross-sectional view taken along line D-D of FIG. 17. For simplicity of description, the following description will focus on differences from the description provided with reference to FIGS. 8 and 9.

For reference, the cross-sectional view taken along line C-C of FIG. 17 may be one of FIGS. 4A, 4B and 7.

Referring to FIGS. 17 and 18, in the semiconductor device according to some embodiments, the number of the gate electrodes separated by the second gate isolation structure GCS2 is smaller than the number of the gate electrodes separated by the first gate isolation structure GCS1.

A first group 120_1, 120_4, and 120_5 of the first gate electrodes may cross the first active pattern AP1 and the second active pattern AP2. The first group 120_1, 120_4, and 120_5 of the first gate electrodes are separated by the first gate isolation structure GCS1 without being separated by the second gate isolation structure GCS2.

A second group 120_2 and 120_3 of the first gate electrodes cross the first active pattern AP1 but do not cross the second active pattern AP2. The second gate electrodes 220_2 and 220_3 may be aligned with the second group 120_2 and 120_3 of the first gate electrodes in the second direction D2. The second gate isolation structure GCS2 may separate the second group 120_2 and 120_3 of the first gate electrodes from the second gate electrodes 220_2 and 220_3.

The following description is made of a case where the cross-sectional view taken along C-C of FIG. 17 is similar to FIG. 4A.

In FIG. 18, a first_second gate electrode 120_2 may overlap the first sidewall 110_s1 of the first lower pattern 110 in the second direction D2 by the first_first depth d11 from the top surface 110us of the first lower pattern 110. The first_second gate electrode 120_2 may overlap the second sidewall 110_s2 of the first lower pattern 110 in the second direction D2 by a first_third depth d13 from the top surface 110us of the first lower pattern 110.

A second_second gate electrode 220_2 may overlap the first sidewall 210_s1 of the second lower pattern 210 in the second direction D2 by a second_third depth d23 from the top surface 210us of the second lower pattern 210. The second_second gate electrode 220_2 may overlap the second sidewall 210_s2 of the second lower pattern 210 in the second direction D2 by the second_second depth d22 from the top surface 210us of the second lower pattern 210.

For example, the first_first depth d11 may be different from the first_third depth d13. In addition, the second_third depth d23 may be different from the second_second depth d22.

In the semiconductor device according to some embodiments, the first_first depth d11 is greater than the first_third depth d13, and the second_second depth d22 is greater than the second_third depth d23.

In the semiconductor device according to some embodiments, the first_first depth d11 may be equal to the second_second depth d22. The second_third depth d23 may be equal to the first_third depth d13.

Unlike the illustrated example, a view taken along line D-D of FIG. 17 and a description thereof may be similar to those provided with reference to FIGS. 10, 11, and 14.

Unlike the above, the cross-sectional view taken along line C-C of FIG. 17 may be similar to FIG. 7.

In this case, a view taken along line D-D of FIG. 17 and a description thereof may be similar to those provided with reference to FIGS. 12, 13, 15, and 16.

Figure 19:
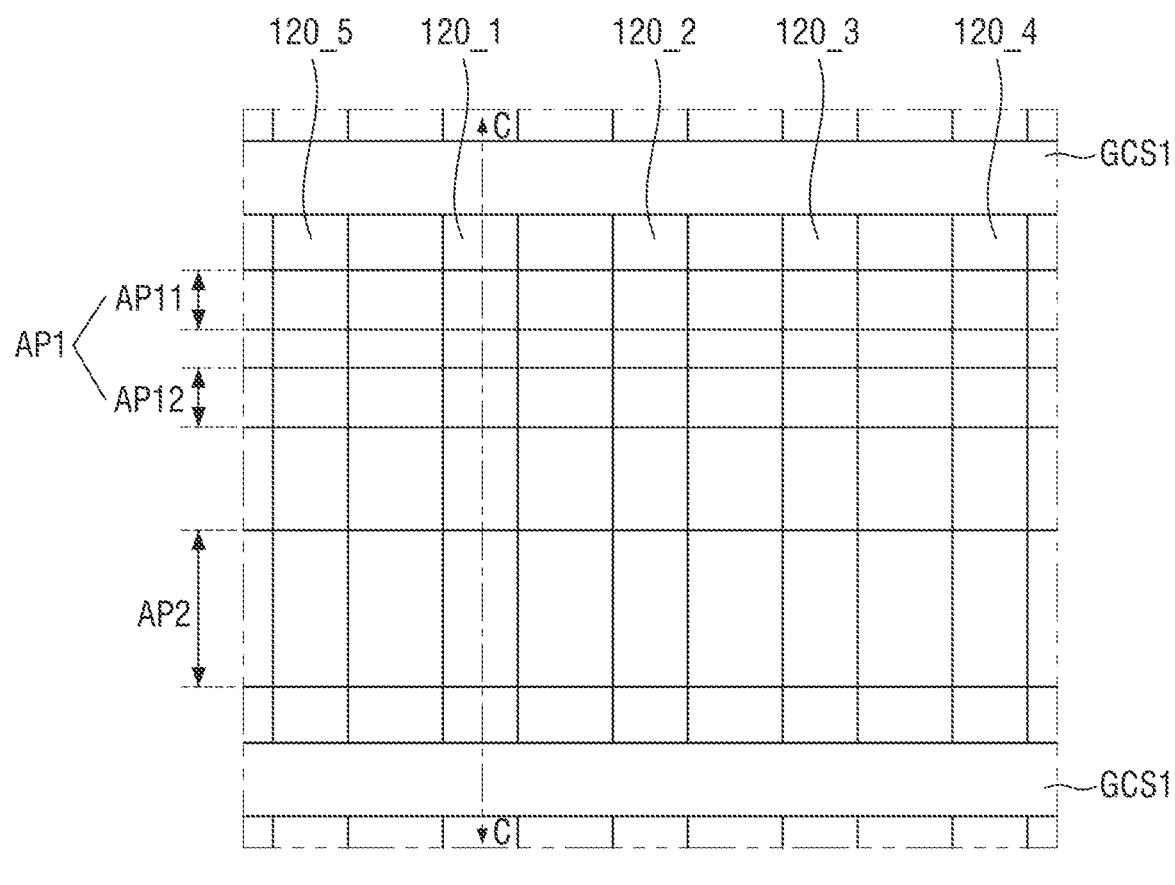
FIG. 19 is a layout diagram illustrating a semiconductor device according to some embodiments of the present inventive concept.
Figure 20:
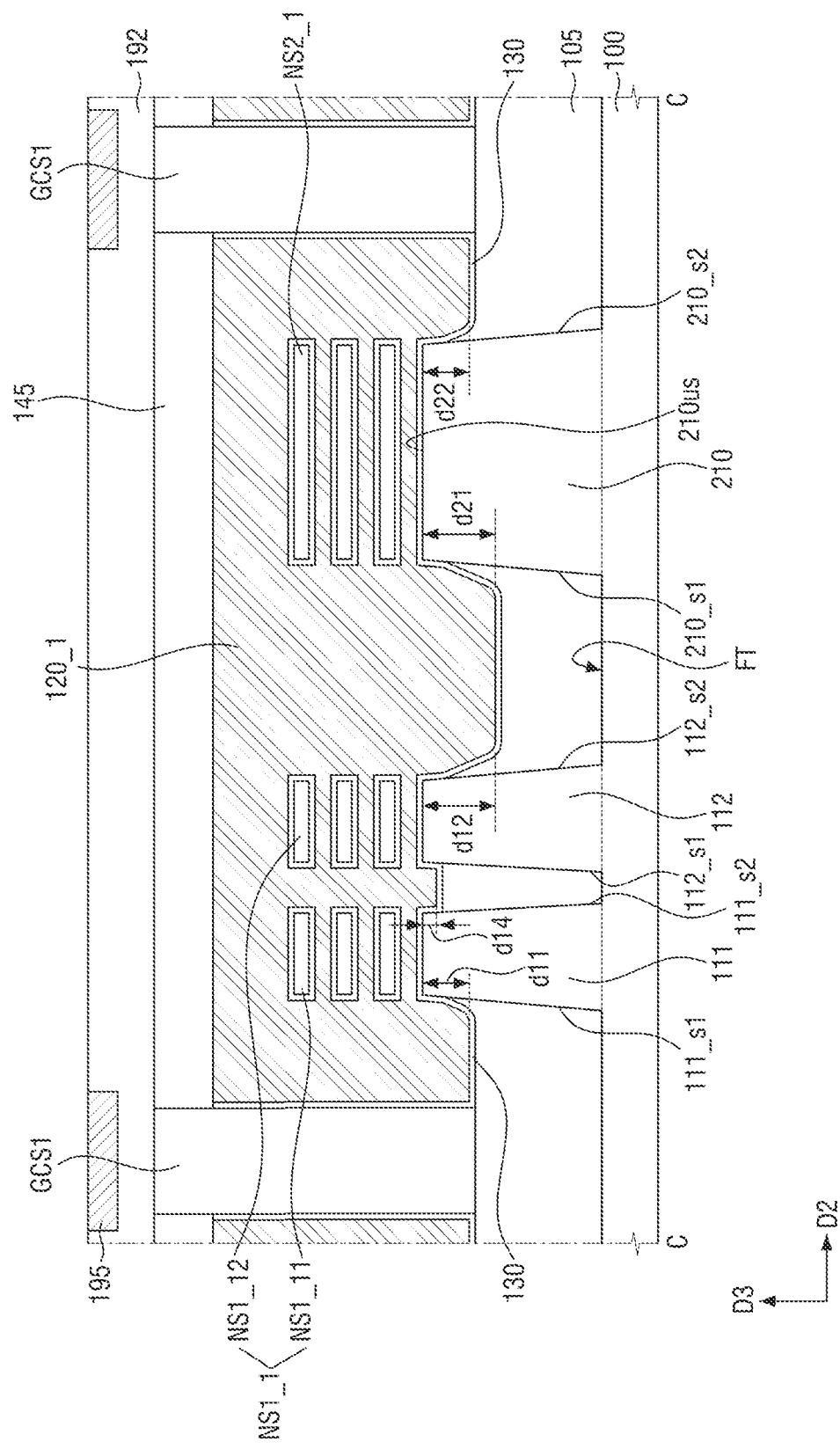
FIG. 20 is a cross-sectional view taken along line C-C of FIG. 19 according to some embodiments of the present inventive concept.

FIG. 19 is a layout diagram illustrating a semiconductor device according to some embodiments of the present inventive concept. FIG. 20 is a cross-sectional view taken along line C-C of FIG. 19. For simplicity of description, the following description will focus on differences from the description provided with reference to FIGS. 1 to 5B.

Referring to FIGS. 19 and 20, in the semiconductor device according to some embodiments, the first active pattern AP1 may include a first sub-active pattern AP11 and a second sub-active pattern AP12.

As one example, the first sub-active pattern AP11 and the second sub-active pattern AP12 may be regions in which a PMOS is formed, and the second active pattern AP2 may be a region in which an NMOS is formed. As another example, the first sub-active pattern AP11 and the second sub-active pattern AP12 may be regions in which an NMOS is formed, and the second active pattern AP2 may be a region in which a PMOS is formed.

Unlike the illustrated example, in some embodiments, the second active pattern AP2 may also include a plurality of sub-active patterns. In some embodiments, the first active pattern AP1 may include three or more sub-active patterns that are spaced apart from each other in the second direction D2.

The first sub-active pattern AP11 may include a first sub-lower pattern 111 and a plurality of first sub-sheet patterns NS1_11. The second sub-active pattern AP12 may include a second sub-lower pattern 112 and a plurality of second sub-sheet patterns NS1_12.

The first sub-lower pattern 111 may be spaced apart from the second sub-lower pattern 112 in the second direction D2. The first sub-lower pattern 111 may be separated from the second sub-lower pattern 112 by the fin trench FT extending in the first direction D1.

The first sub-lower pattern 111 may include a first sidewall 111_s1 and a second sidewall 111_s2 opposite to each other. The second sub-lower pattern 112 may include a first sidewall 112_s1 and a second sidewall 112_s2 opposite to each other.

The second sidewall 111_s2 of the first sub-lower pattern 111 may face the first sidewall 112_s1 of the second sub-lower pattern 112. The second sidewall 112_s2 of the second sub-lower pattern 112 may face the first sidewall 210_s1 of the second lower pattern 210.

The first sub-sheet pattern NS1_11 may be disposed above the first sub-lower pattern 111. The second sub-sheet pattern NS1_12 may be disposed above the second sub-lower pattern 112.

The first_first gate electrode 120_1 may surround the first sub-sheet pattern NS1_11 and the second sub-sheet pattern NS1_12.

The first_first gate electrode 120_1 may overlap the first sidewall 111_s1 of the first sub-lower pattern 111 in the second direction D2 by a first_first depth d11 from the top surface of the first sub-lower pattern 111. The first_first gate electrode 120_1 may overlap the second sidewall 112_s2 of the second sub-lower pattern 112 in the second direction D2 by a first_second depth d12 from the top surface of the second sub-lower pattern 112. In addition, the first_first gate electrode 120_1 may overlap the second sidewall 111_s2 of the first sub-lower pattern 111 in the second direction D2 by a first_fourth depth d14 from the top surface of the first sub-lower pattern 111.

For example, the first_fourth depth d14 is smaller than the first_second depth d12. The first_fourth depth d14 may be smaller than the first_first depth d11. In some embodiments, the first_fourth depth d14 may be equal to the first_first depth d11. In some embodiments, the first_fourth depth d14 may be greater than the first_first depth d11.

FIGS. 21 to 25 are cross-sectional views illustrating a method of manufacturing a semiconductor device according to some embodiments of the present inventive concept.

For reference, FIGS. 21 to 25 are cross-sectional views taken along line C-C of FIG. 1.

Figure 21:
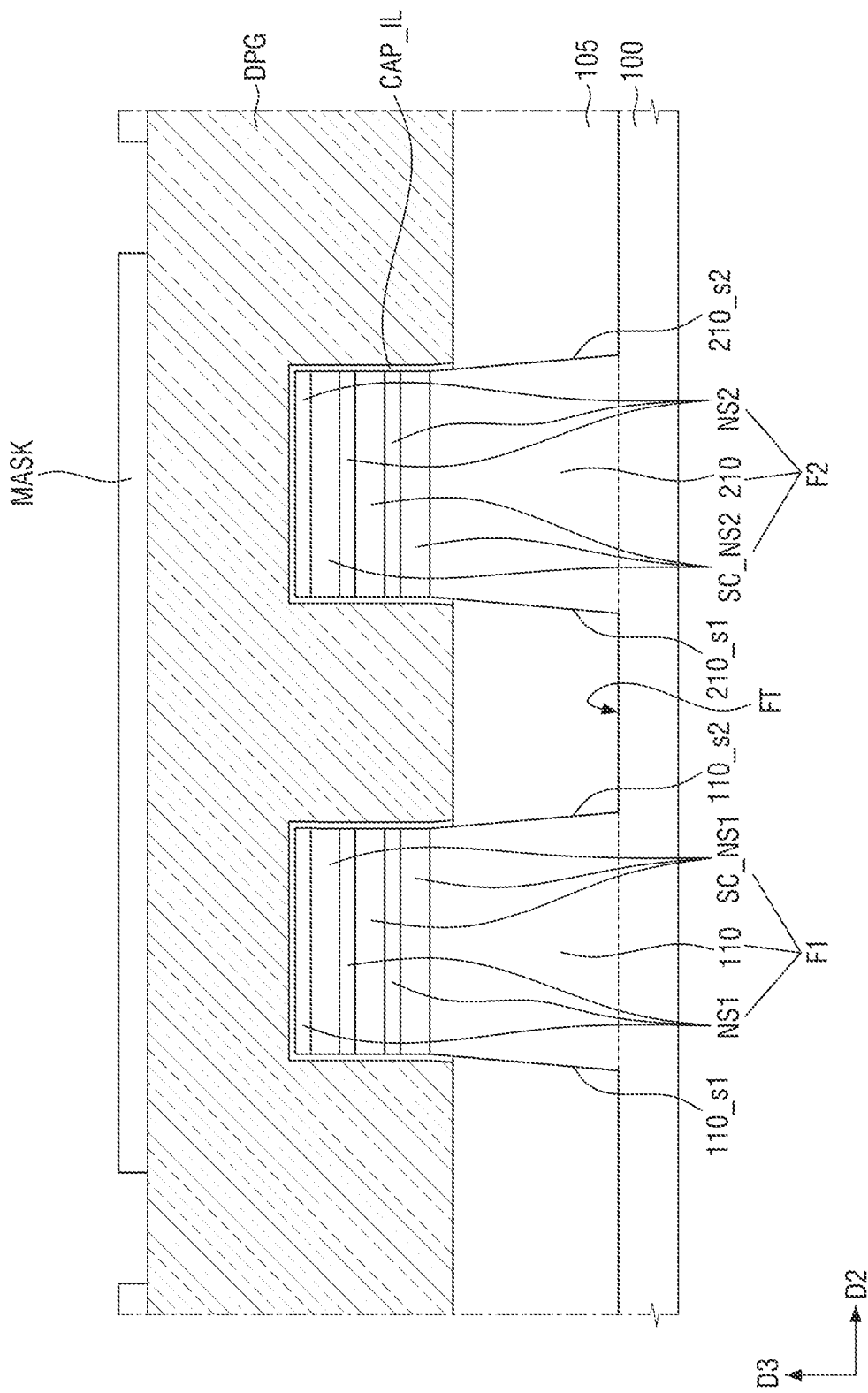
FIGS. 21 to 25 are cross-sectional views illustrating a method of manufacturing a semiconductor device according to some embodiments of the present inventive concept.

Referring to FIG. 21, a first fin F1 and a second fin F2 defined by the fin trench FT may be formed on the substrate 100.

Each of the first fin F1 and the second fin F2 may be elongated in the first direction D1 (see FIG. 1). The first fin F1 may be spaced apart from the second fin F2 in the second direction D2.

The first fin F1 may include the first lower pattern 110, first sheet patterns NS1, and first sacrificial patterns SC_NS1. The first sheet patterns NS1 and the first sacrificial patterns SC_NS1 may be alternately disposed on the first lower pattern 110.

The first lower pattern 110 may include the first sidewall 110_s1 and the second sidewall 110_s2 defined by the fin trenches FT.

The second fin F2 may include the second lower pattern 210, second sheet patterns NS2, and second sacrificial patterns SC_NS2. The second sheet patterns NS2 and the second sacrificial patterns SC_NS2 may be alternately disposed on the second lower pattern 210.

The second lower pattern 210 may include the first sidewall 210_s1 and the second sidewall 210_s2 defined by the fin trenches FT.

The field insulating layer 105 may be formed on the substrate 100. The first sheet patterns NS1 and the first sacrificial patterns SC_NS1 may protrude more upward than the top surface of the field insulating layer 105. The second sheet patterns NS2 and the second sacrificial patterns SC_NS2 may protrude more upward than the top surface of the field insulating layer 105.

A fin protective layer CAP_IL may be formed on the first fin F1 and the second fin F2. The fin protective layer CAP_IL is illustrated to be formed along the profiles of the first fin F1 and the second fin F2 protruding more upward than the top surface of the field insulating layer 105, but is not limited thereto.

Unlike the illustrated example, the fin protective layer CAP_IL may extend along the first sidewall 110_s1 of the first lower pattern 110, the second sidewall 110_s2 of the first lower pattern 110, the first sidewall 210_s1 of the second lower pattern 210, and the second sidewall 210_s2 of the second lower pattern 210. In some embodiments, the fin protective layer CAP_IL may extend between the first lower pattern 110 and the field insulating layer 105 and may extend between the second lower pattern 210 and the field insulating layer 105.

A dummy gate electrode DPG may be formed on the field insulating layer 105. The dummy gate electrode DPG covers the fin protective layer CAP_IL.

Subsequently, a mask pattern MASK may be formed on the dummy gate electrode DPG.

Figure 22:
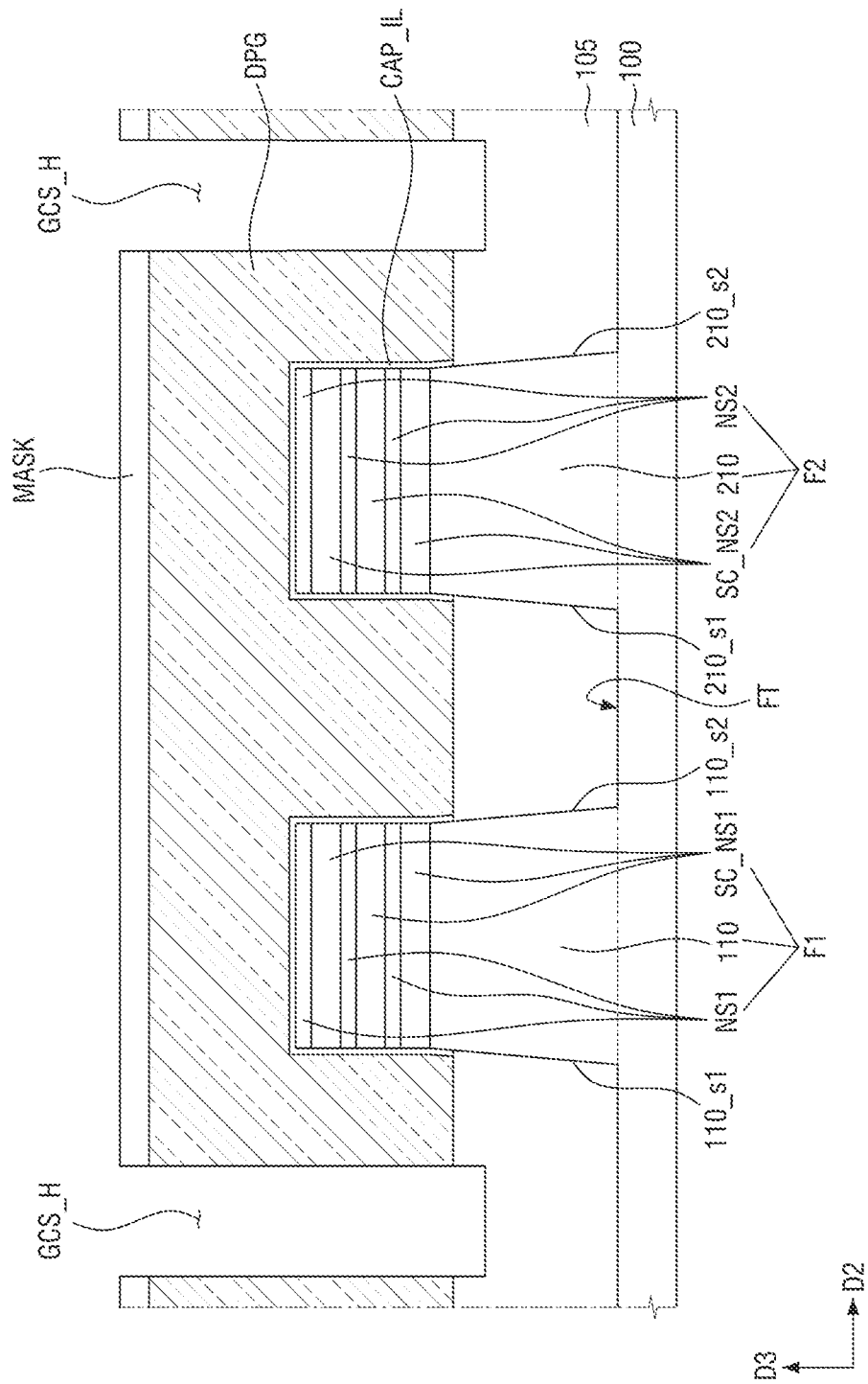

Referring to FIG. 22, gate isolation trenches GCS_H penetrating the dummy gate electrode DPG may be formed using the mask pattern MASK.

While the gate isolation trenches GCS_H are formed, a portion of the field insulating layer 105 may be removed, but the present disclosure is not limited thereto.

Figure 23:
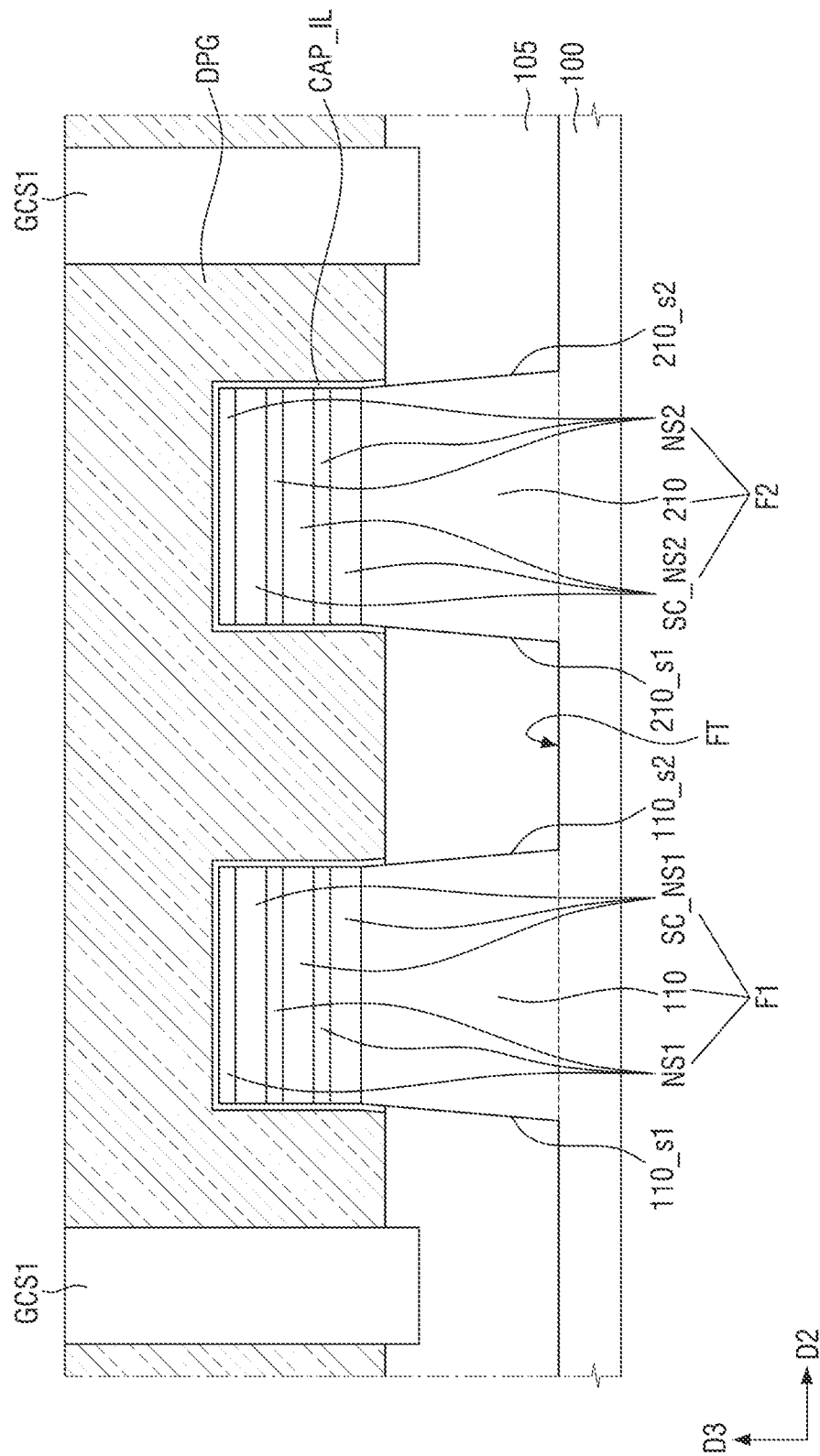

Referring to FIG. 23, the first gate isolation structures GCS1 filling the gate isolation trenches GCS_H may be formed on the field insulating layer 105.

Subsequently, the mask pattern MASK may be removed.

Figure 24:
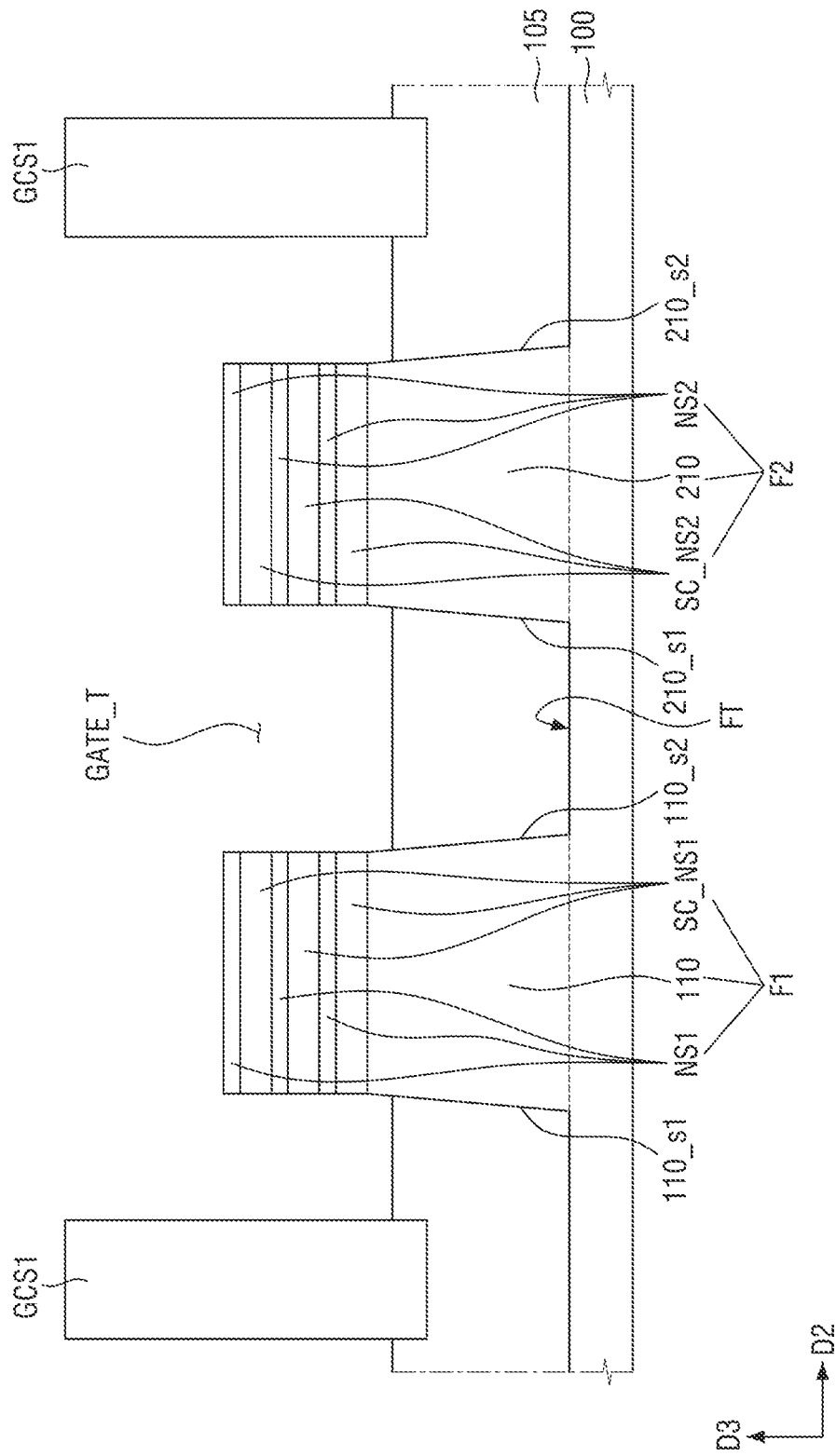

Referring to FIG. 24, the dummy gate electrode DPG may be removed while leaving the first gate isolation structures GCS1.

Since the dummy gate electrode DPG is removed, a gate trench GATE_T may be formed between the first gate isolation structures GCS1.

The gate trench GATE_T exposes the field insulating layer 105.

Subsequently, the fin protective layer CAP_IL is removed to expose the first sheet patterns NS1, the first sacrificial patterns SC_NS1, the second sheet patterns NS2, and the second sacrificial patterns SC_NS2.

Figure 25:
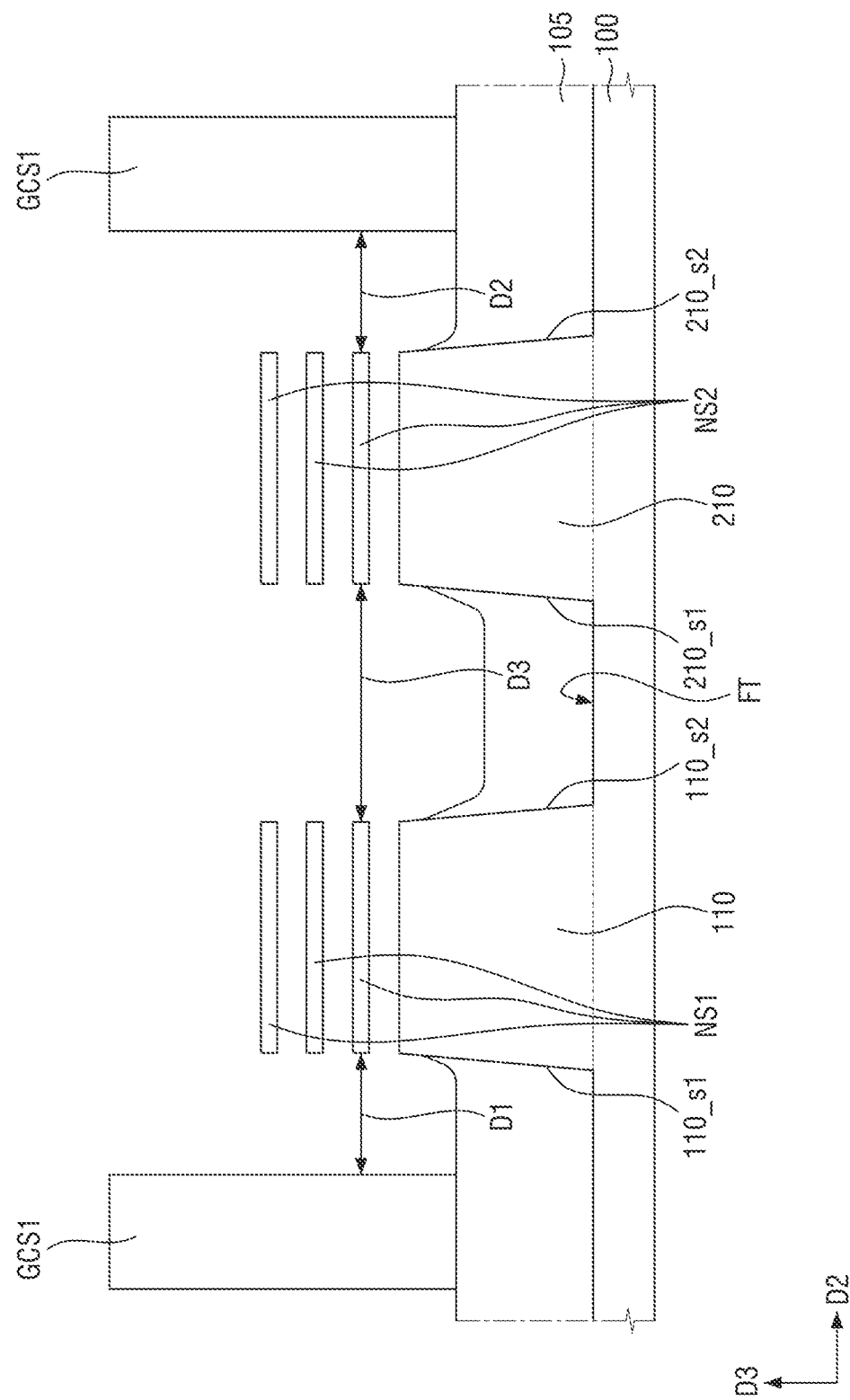

Referring to FIG. 25, the first sacrificial patterns SC_NS1 between the first sheet patterns NS1 adjacent in the third direction D3 are removed to separate the first sheet patterns NS1 from the first lower pattern 110. The second sacrificial patterns SC_NS2 between the second sheet patterns NS2 adjacent in the third direction D3 are removed to separate the second sheet patterns NS2 from the second lower pattern 210.

The first sacrificial patterns SC_NS1 and the second sacrificial patterns SC_NS2 may be selectively removed due to the etch selectivity of the material. The first sacrificial patterns SC_NS1 and the second sacrificial patterns SC_NS2 may include a material that has an etch selectivity with respect to the first sheet patterns NS1 and the second sheet patterns NS2.

While the first sacrificial patterns SC_NS1 and the second sacrificial patterns SC_NS2 are removed, a portion (e.g., an upper portion) of the field insulating layer 105 may also be removed.

The amount of the field insulating layer 105 removed while removing the first sacrificial patterns SC_NS1 and the second sacrificial patterns SC_NS2 may be different according to a first distance D1 between the first gate isolation structure GCS1 and the first sheet pattern NS1, a second distance D2 between the first gate isolation structure GCS1 and the second sheet pattern NS2, and a third distance D3 between the first sheet pattern NS1 and the second sheet pattern NS2.

When the third distance D3 is greater than the first distance D1 and the second distance D2, the largest amount of the field insulating layer 105 between the first sheet pattern NS1 and the second sheet pattern NS2 may be removed.

Subsequently, referring back to FIG. 4A, the first gate insulating layer 130 and the first_first gate electrode 120_1 may be formed.

Although not shown, the second gate isolation structure GCS2 of FIG. 8 may be formed in the same manner as the first gate isolation structure GCS1.

In concluding the detailed description, those skilled in the art will appreciate that many variations and modifications can be made to the embodiments described herein without substantially departing from the principles of the present inventive concept. Therefore, the embodiments described herein are used in a generic and descriptive sense only and not for purposes of limitation. Thus, to the maximum extent allowed by law, the scope is to be determined by the broadest permissible interpretation of the following claims and their equivalents, and shall not be restricted or limited by the foregoing detailed description.

What is claimed is:

1. A semiconductor device comprising:
   a first active pattern including a first lower pattern extending in a first direction and a first sheet pattern spaced apart from the first lower pattern, the first lower pattern including a first sidewall and a second sidewall opposite to each other;
   a second active pattern including a second lower pattern spaced apart from the first lower pattern in a second direction different from the first direction and a second sheet pattern spaced apart from the second lower pattern, the second lower pattern including a third sidewall facing the second sidewall and a fourth sidewall opposite to the third sidewall;
   a first gate electrode on the first lower pattern and the second lower pattern, the first gate electrode extending in the second direction and surrounding at least a portion of the first sheet pattern and a portion of the second sheet pattern;
   a first gate insulating layer extending along the first active pattern and the second active pattern,
   a first cell isolation structure facing the first sidewall; and
   a second cell isolation structure facing the fourth sidewall,
   wherein a first width of the first gate electrode between the second sidewall and the third sidewall is greater than a second width of the first gate electrode between the first cell isolation structure and the first sidewall,
   wherein the second width of the first gate electrode is greater than a third width of the first gate electrode between the fourth sidewall and the second cell isolation structure,
   wherein the first gate electrode overlaps the first sidewall of the first lower pattern in the second direction by a first depth,
   the first gate electrode overlaps the second sidewall of the first lower pattern in the second direction by a second depth, the first gate electrode overlaps the third sidewall of the second lower pattern in the second direction by a third depth, the first gate electrode overlaps the fourth sidewall of the second lower pattern in the second direction by a fourth depth, and the second depth is equal to the third depth and is greater than the first depth, the third depth is greater than the fourth depth, the first depth is greater than the fourth depth, and wherein a bottom surface of the first cell isolation structure is lower than a lowermost surface of the first gate insulating layer.

2. The semiconductor device of claim 1, wherein:
a width of a top surface of the first lower pattern and a width of a top surface of the second lower pattern are equal.

3. The semiconductor device of claim 1, wherein the first gate insulating layer extends along a sidewall of the first cell isolation structure and a sidewall of the second cell isolation structure.

4. The semiconductor device of claim 1, wherein:
a width of the first cell isolation structure and a width of the second cell isolation structure are equal.

5. The semiconductor device of claim 1, wherein:
a width of the first sheet pattern decreases as a distance from the first lower pattern increases.

6. A semiconductor device comprising:
a first active pattern including a first lower pattern extending in a first direction and a first sheet pattern spaced apart from the first lower pattern, the first lower pattern including a first sidewall and a second sidewall opposite to each other;

a second active pattern including a second lower pattern spaced apart from the first lower pattern in a second direction different from the first direction and a second sheet pattern spaced apart from the second lower pattern, the second lower pattern including a third sidewall facing the second sidewall and a fourth sidewall opposite to the third sidewall;

a third active pattern including a third lower pattern spaced apart from the first lower pattern in the second direction and a third sheet pattern spaced apart from the third lower pattern, the third lower pattern including a fifth sidewall facing the fourth sidewall and a sixth sidewall opposite to the fifth sidewall; and a first gate electrode on the first lower pattern, the second lower pattern and the third lower pattern, the first gate electrode extending in the second direction and surrounding at least a portion of the first sheet pattern, a portion of the second sheet pattern and a portion of the third sheet pattern, wherein the first gate electrode overlaps the second sidewall of the first lower pattern in the second direction by a first depth, the first gate electrode overlaps the fourth sidewall of the second lower pattern in the second direction by a second depth, wherein the first gate electrode overlaps the first sidewall of the first lower pattern in the second direction by a third depth, the first depth is less than the second depth, and the third depth is less than the second depth.

7. The semiconductor device of claim 6, wherein
a first distance between the second sidewall and the third sidewall is less than a second distance between the fourth sidewall and the fifth sidewall.

8. The semiconductor device of claim 6, wherein
the first gate electrode overlaps the fifth sidewall of the second lower pattern in the second direction by a fourth depth, and the second depth and the fourth depth are equal.

9. The semiconductor device of claim 6, wherein
the third depth is greater than the first depth.

10. The semiconductor device of claim 6, wherein
a width of a top surface of the first lower pattern and a width of a top surface of the second lower pattern are equal.

11. The semiconductor device of claim 6, wherein
a width of a top surface of the first lower pattern and a width of a top surface of the second lower pattern are less than a width of a top surface of the third lower pattern.

12. The semiconductor device of claim 6, further comprising:
a first cell isolation structure facing the first sidewall and intersecting the first gate electrode; and a second cell isolation structure facing the sixth sidewall and intersecting the first gate electrode, wherein a third distance between the first cell isolation structure and the first sidewall and a fourth distance between the second cell isolation structure and the sixth sidewall are less than a fifth distance between the fourth sidewall and the fifth sidewall.

13. The semiconductor device of claim 12, wherein
a width of the first cell isolation structure and a width of the second cell isolation structure are equal.

14. The semiconductor device of claim 12, wherein
a distance between the first cell isolation structure and the first sidewall is greater than a distance between the second sidewall and the third sidewall.

15. The semiconductor device of claim 6, wherein
the first gate electrode overlaps the fifth sidewall of the second lower pattern in the second direction by a fourth depth, the first gate electrode overlaps the sixth sidewall of the second lower pattern in the second direction by a fifth depth, and the fifth depth is less than the fourth depth.

16. A semiconductor device comprising
a first active pattern including a first lower pattern extending in a first direction and a first sheet pattern spaced apart from the first lower pattern, the first lower pattern including a first sidewall and a second sidewall opposite to each other;

a second active pattern including a second lower pattern spaced apart from the first lower pattern in a second direction different from the first direction and a second sheet pattern spaced apart from the second lower pattern, the second lower pattern including a third sidewall facing the second sidewall and a fourth sidewall opposite to the third sidewall;

a first gate electrode on the first lower pattern and the second lower pattern, the first gate electrode extending in the second direction and surrounding at least a portion of the first sheet pattern and a portion of the second sheet pattern;

a first cell isolation structure facing the first sidewall; and a second cell isolation structure facing the fourth sidewall, wherein the first gate electrode overlaps the first sidewall of the first lower pattern in the second direction by a first depth, the first gate electrode overlaps the second sidewall of the first lower pattern in the second direction by a second depth, the first gate electrode overlaps the third sidewall of the second lower pattern in the second direction by a third depth, the first gate electrode overlaps the fourth sidewall of the second lower pattern in the second direction by a fourth depth, the fourth depth is less than the third depth, and the first depth is less than the second depth.

17. The semiconductor device of claim 16, wherein:

a first distance between the first cell isolation structure and the first sidewall and a second distance between the second cell isolation structure and the fourth sidewall are less than a third distance between the second sidewall and the third sidewall.

18. The semiconductor device of claim 16, wherein:

the second depth and the third depth are equal.

19. The semiconductor device of claim 16, wherein:

a width of a top surface of the first lower pattern and a width of a top surface of the second lower pattern are equal.

20. The semiconductor device of claim 16, wherein:

the first depth and the fourth depth are equal.

* * * * *